(12) United States Patent
Kawasaki et al.

(10) Patent No.: US 6,844,249 B2
(45) Date of Patent: Jan. 18, 2005

(54) METHOD FOR MANUFACTURING A SEMICONDUCTOR DEVICE USING LASER LIGHT

(75) Inventors: Ritsuko Kawasaki, Kanagawa (JP); Kenji Kasahara, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/648,288

(22) Filed: Aug. 27, 2003

(65) Prior Publication Data

US 2004/0092061 A1 May 13, 2004

Related U.S. Application Data

(62) Division of application No. 10/124,489, filed on Apr. 18, 2002, now Pat. No. 6,624,013, which is a division of application No. 09/612,100, filed on Jul. 7, 2000, now Pat. No. 6,426,245.

(30) Foreign Application Priority Data

Jul. 9, 1999 (JP) ............................................. 11-196790

(51) Int. Cl.[7] .............................................. H01L 21/20
(52) U.S. Cl. ...................... 438/487; 438/486; 438/149; 438/160
(58) Field of Search ................................ 438/149, 151, 438/160, 485, 486, 487, 482

(56) References Cited

U.S. PATENT DOCUMENTS

| | | |
|---|---|---|
| 5,612,251 A | 3/1997 | Lee |
| 5,643,826 A | 7/1997 | Ohtani et al. |
| 5,767,003 A | 6/1998 | Noguchi |
| 5,923,962 A | 7/1999 | Ohtani et al. |
| 5,953,597 A | 9/1999 | Kusumoto et al. |
| 6,020,224 A | 2/2000 | Shimogaichi et al. |
| 6,246,524 B1 | 6/2001 | Tanaka |
| 6,248,606 B1 | 6/2001 | Ino et al. |
| 6,380,009 B1 | 4/2002 | Battersby |
| 6,426,245 B1 | 7/2002 | Kawasaki et al. |
| 6,624,013 B2 * | 9/2003 | Kawasaki et al. .......... 438/160 |

FOREIGN PATENT DOCUMENTS

| | | |
|---|---|---|
| JP | 07-130652 A | 5/1995 |
| JP | 08-228006 A | 9/1996 |

OTHER PUBLICATIONS

K. Shimizu, O. Sugiura, M. Matsumura, "High Mobility Poly–Si Thin Film Transistors Fabricated by a Novel Excimer Laser Crystallization Method", IEEE Transactions on Electron Devices, vol., 40, No. 1, pp. 112–117, Jan., 1993.

* cited by examiner

*Primary Examiner*—Michael S. Lebentritt
*Assistant Examiner*—Brad Smith
(74) *Attorney, Agent, or Firm*—Jeffrey L. Costellia; Nixon Peabody LLP

(57) ABSTRACT

The invention relates to a method for manufacturing a semiconductor device, and it is an object of the invention to form a semiconductor area formed in island-like patterns as a single crystal or an area which can be regarded as a single crystal, and to simultaneously achieve a laminated structure by which various characteristics of TFTs can be stabilized, wherein an insulation film is formed on a glass substrate, and island-like semiconductor layer is formed thereon. A laser beam passed through a cylindrical lens is made into a linear laser beam and irradiated onto the island-like semiconductor layer by an optical system. The island-like semiconductor layer is subjected to two components, one of which is a direct laser beam component passing through the cylindrical lens and being irradiated directly onto the island-like semiconductor layer, and the other of which is a diffused laser beam component transmitting an insulation film and a substrate, being reflected by a reflection plate, and again transmitting the substrate and insulation film and being irradiated onto the island-like semiconductor laser.

10 Claims, 27 Drawing Sheets

EXTERIOR VIEW

SECTIONAL VIEW

PIXEL PORTION

METHOD FOR MANUFACTURING A SEMICONDUCTOR DEVICE USING LASER LIGHT

CROSS REFERENCE TO RELATED APPLICATIONS

This application is a division of application Ser. No. 10/124,489, filed Apr. 18, 2002, now U.S. Pat. No. 6,624,013 which is a DIV of Ser. No. 09/612,100 filed on Jul. 07, 2000 now U.S. Pat. No. 6,426,245.

BACKGROUND OF THE INVENTION

1. Field of the Invention

The present invention relates to a method for manufacturing a semiconductor layer having a crystalline structure formed on a substrate having an insulation surface, and in particular a method for manufacturing a semiconductor device in which the corresponding semiconductor layer is used in an active layer. Especially, the invention is oriented at a method for producing a thin film transistor in which an active layer is formed from a crystalline semiconductor layer. Also, in the specification, a "semiconductor device" includes all types of devices which can function by utilizing semiconductor characteristics, wherein the category thereof includes electro-optical devices represented by an active matrix type liquid crystal display device formed by using a thin film transistor, and an electronic apparatus in which such an electro-optical device is incorporated.

2. Description of Related Art

A thin film transistor (hereinafter called "TFT") has been developed, in which an amorphous semiconductor layer is formed on an insulation substrate having a light transmission property such as glass, and a crystalline semiconductor layer which is crystallized by a laser annealing method and a thermal annealing method, etc. In many cases, glass substrates made of barium borosilicate glass and aluminum borosilicate glass, etc., are used. Since the market price of such glass substrates are inexpensive, though they are inferior to quartz substrates in terms of heat-resistance, such glass substrates have an advantage in that large-area substrates can be easily produced.

The laser annealing method has been known as a crystallizing technique by which amorphous semiconductor layers can be crystallized by providing a high energy onto only the amorphous semiconductor layers without raising the temperature of the glass substrates. In particular, it is considered that an excimer laser which is capable of providing a large output of short wavelengths is optimal. The laser annealing using an excimer laser is carried out by processing the laser beam so as to, by an optical system, make the beam spot-like or linear on a surface to be irradiated, and by scanning with the processed laser beam on the irradiated surface (relatively moving the irradiation position of the laser beam with respect to the irradiated surface). For example, an excimer laser annealing method in which a linear laser beam is used enables laser annealing on the entire irradiated surface by scanning in a direction orthogonal to the lengthwise direction thereof. Since the productivity thereof is excellent, the laser annealing method becomes the main stream as the production technology of a liquid crystal display device using TFT. The technology enabled a monolithic type liquid crystal display device in which a pixel TFT forming a pixel portion and a TFT of a drive circuit secured around the pixel portion are formed on a single glass substrate.

However, the crystalline semiconductor layer produced by the laser annealing method is formed by gathering a plurality of crystalline grains, and the position and size of the crystalline grains are random. TFTs produced on the glass substrate are formed so that the crystalline semiconductor layer is separated into island-like patterns for the separation of elements. In this case, the TFT could not be formed while specifying the positions and sizes of the crystalline grains. On the boundary of crystalline grains (crystalline grain phase), a lowering of the current carrying characteristics of a carrier was caused by the influences of a potential level at the re-coupling center, capturing center and crystalline grain boundary resulting from the amorphous structure and crystallizing defect. But, it is almost impossible that a channel forming region in which the crystalline characteristics seriously influence the characteristics of the TFTs is formed with mono-crystalline grains by excluding the influences of the crystalline grain boundary. Therefore, the TFTs, in which a crystalline silicon film is used as an active layer, having characteristics equivalent to those of a MOS transistor produced on a mono-crystalline silicon substrate could not be obtained until today.

In order to solve these problems, an attempt to increase the crystalline grain size has been made. For example, in "High-Mobility Poly-Si Thin-Film Transistors Fabricated by a Novel Excimer Laser Crystallization Method", prepared by K. Shimizu, O. Sugiura and M. Matsumura, IEEE Transactions on Electron Devices, Vol. 40., No. 1, pp112–117, 1993, a report is given of a dual beam laser annealing method in which a film of three layered ($Si/SiO_2/Si$) structure is formed, and an excimer laser beam is irradiated from both the film side and the substrate side. According to the method, by irradiating a laser beam at a specified energy intensity, it is possible to increase the crystalline grain size.

In a monolithic type liquid crystal display device, a pixel portion for performing image display and a drive circuit are formed on the same substrate. The pixel portion is provided with a pixel TFT and a holding capacitor while the drive circuit is provided with a shift register circuit, a level shifter circuit, a buffer circuit, a sampling circuit, etc., which are formed on the basis of a CMOS circuit. However, the operating conditions of the pixel TFTs are not the same as those of the drive circuit TFTs, whereby the characteristics requested in the TFTs differ to some degree. For example, the pixel TFT functions as a switching element, and is driven by applying voltage to liquid crystal. Since liquid crystal is driven by an alternate current, a system called "frame reversing drive" is frequently employed. In the system, the characteristics requested of the pixel TFTs is a sufficiently decreased OFF current value (that is, the drain current flowing when the TFTs are turned off) in order to suppress power consumption to a sufficiently low level. On the other hand, since a high drive voltage is applied to the buffer circuit of the control circuit, it is necessary that the withstand is sufficiently increased so that it is not broken when a high voltage is applied. Further, in order to increase the current drive capacity, it is necessary to sufficiently secure the ON current value (that is, the drain current flowing when the TFT is turned on).

Also, in order to control the threshold voltage (hereinafter called "Vth"), which is an important characteristic parameter in the TFTs, in a specified range, it was necessary to decrease a charge defect population of the underground film, gate insulation layer and interlayer insulation film, which are formed of an insulation layer in close contact with the active layer, in addition to valence electron control of the channel forming region, and it also was necessary to take the balance of the internal stress into consideration. With respect to such a request, a material containing silicon such as a silicon oxide layer and a silicon oxide nitride layer, etc., as a component element was suitable.

Thus, in an attempt to improve the performance of a monolithic type liquid crystal display device, an attempt to improve the performance of TFTs by only increasing the crystalline grain size of a crystalline semiconductor layer forming the active layer is insufficient, and it was necessary to take various characteristics of the active layer, the underground film, gate insulation layer and interlayer insulation film, which are formed above and below the active layer, into consideration.

The present invention is a technology to solve these and other problems. It is therefore an object of the invention to achieve a semiconductor area formed of island-like patterns formed to be mono-crystalline or an area which can be regarded as mono-crystal, and at the same time, to achieve a lamination structure which can stabilize various characteristics of the TFTs. Further, in a semiconductor device represented by a monolithic type liquid crystal display device in which a plurality of circuits are formed on the same substrate, wherein arrangement or orientation of TFTs having adequate properties is enabled on the basis of the specifications requested by the function circuits thereof, and the operation characteristics and reliability can be achieved remarkably well.

SUMMARY OF THE INVENTION

A laser annealing method is used as a method for forming a crystalline semiconductor layer from an amorphous semiconductor layer formed on a substrate such as glass. In the laser annealing method according to the invention, a pulse oscillation type or continuous light emission type excimer laser or argon laser is used as its light source, and a laser beam formed to be linear by an optical system is irradiated onto both the surface (in the specification, the surface is defined to be a plane on which an island-like semiconductor layer is formed) and rear side (in the specification, the rear side is defined to be a plane which is the opposite side of the plane where an island-like semiconductor layer is formed) of a substrate.

FIG. 3A is a view showing a configuration of such a laser annealing apparatus. The laser annealing apparatus has a stage 1202 on which a laser oscillator 1201, an optical system 1100 and a substrate are fixed. The stage 1202 is provided with a heater 1203 and a heater controller 1204, which can heat the substrate to a temperature of 100 through 450° C. A reflection plate 1205 is provided on the stage 1202, and a substrate 1206 is installed thereon. In the construction of the laser annealing apparatus so composed as in FIG. 3A, a description is given of a holding method of the substrate 1206 with reference to FIG. 3B. The substrate 1206 held on the stage 1202 is installed in a reaction chamber 1213, and a laser beam is irradiated thereonto. The interior of the reaction chamber 1213 can be pressure-reduced or filled with an inactive gas by an exhaust system or a gas system, neither of which is illustrated, wherein a semiconductor can be heated to a temperature of 100 through 450° C. without being contaminated. The stage 1202 can move in the reaction chamber along a guide rail 1216, wherein a linear laser beam can be irradiated onto the entire surface of the substrate. The laser beam comes in through a quartz window (not illustrated) secured on the upper surface of the substrate 1206. Also, in FIG. 3B, a transfer chamber 1210, an intermediate chamber 1211, and a load/unload chamber 1212 are connected to the reaction chamber 1213, which are separated by sluice valves 1217 and 1218. A cassette 1214 capable of holding a plurality of substrates is installed in the load/unload chamber 1212, and a substrate is transferred by a transfer robot 1215 secured in the transfer chamber 1210. The substrate 1206 indicates a substrate being transferred. With such a construction, the laser annealing can be continuously carried out in a pressure-reduced state or an inactive gas atmosphere.

FIGS. 2A and B are views which explain an optical system construction of the laser annealing apparatus illustrated in FIG. 3A. An excimer laser and argon laser may be applied to the laser oscillator 1101. FIG. 2A is a view showing a state where the optical system 1100 is observed from the side, wherein the laser beam outgoing from the laser oscillator 1101 is split in the longitudinal direction by an cylindrical lens array 1102. The split laser beams are widened once they are collected by the cylindrical lens 1104, and are reflected by a mirror 1107. Thereafter, they are controlled by a cylindrical lens 1108 so that they become a linear laser beam on an irradiation plane 1109. Thereby, it is possible to make energy distribution of the linear laser beam in the width direction uniform. Also, FIG. 2B is a view showing a state where the optical system 1100 is observed from above. The laser beam outgoing from the laser oscillator 1101 is split in the cross direction by a cylindrical lens array 1102. After that, the laser beam is synthesized to be singular on the irradiation plane 1109 by a cylindrical lens 1105, whereby the energy distribution of the linear laser beam in the lengthwise direction can be made uniform.

Further, FIG. 1 is a view to explain the concept of a laser annealing method according to the present invention. An insulation layer 1002 is formed on a substrate 1001 such as glass, and an island-like semiconductor layer 1003 is formed thereon. The insulation layer 1002 may be an insulation layer whose constituents are a silicon oxide film, a silicon nitride film, a silicon oxide nitride film, and aluminum. That is, the insulation layer 1002 may be singular, or these films may be adequately combined with each other. And, a laser beam passed through a cylindrical lens 1005 having the same features as those of the cylindrical lens 1108 is irradiated onto the island-like semiconductor layer 1003 as a linear laser beam by the optical system 1100 described with reference to FIGS. 2A and B. The island-like semiconductor layer 1003 is provided with a direct laser light components 1006 passed through the cylindrical lens 1005 and irradiated directly onto the island-like semiconductor layer 1003, and diffused laser components 1007 which penetrate the insulation layer 1002 and substrate 1001, are reflected by the reflection plate 1004, again penetrated the insulation plate 1001 and insulation layer 1002 and are irradiated onto the island-like semiconductor layer 1003. In either of the cases, since the laser beam that passed through the cylindrical lens 1005 will have an incident angle of 45 through 90° with respect to the substrate surface in the process of condensing light, the laser beam reflected by the reflection plate 1004 is also reflected toward the inside direction of the island-like semiconductor layer 1003. At the reflection plate 1004, its reflection plane is formed of aluminum. If the reflection plane is mirror-finished, a positive reflectivity of approx. 90% can be obtained in a range of 240 through 320 nm in wavelength. Also, where the material is aluminum, and minute dents and projections of several hundreds of nanometers are formed, a diffusion reflectivity of 50 through 70% can be obtained (Integral reflectivity–Positive reflectivity).

Thus, a laser beam is irradiated onto both the surface and rear side of a substrate, and the island-like semiconductor layer 1003 formed on the substrate 1001 is laser-annealed on both sides thereof. In the laser annealing method, a semiconductor film is instantaneously heated and melted by optimizing the conditions of the laser beam to be irradiated, a generation density of crystalline nuclei and crystallizing growth from the crystalline nuclei can be controlled. Since the oscillation pulse width of the excimer laser is from several nanoseconds through several hundred nanoseconds, for example, 30 nanoseconds, if irradiation is performed with the pulse generation frequency set to 30 Hz, the semiconductor layer at the area where the laser beam is irradiated is instantaneously heated by a pulse laser beam, and it is cooled down for a considerably longer period of time than the heating time.

Irradiation of a laser beam onto only one side heats only one side of the semiconductor layer formed on a substrate, the cycle of heating to melt and solidification to cool becomes very rapid, and sufficient crystallizing growth cannot be expected even though the generation density of crystalline nuclei can be controlled. However, if a laser beam is irradiated onto to both sides of a semiconductor layer, the cycle from heating to melt to solidifying by cooling becomes gentle, whereby the time permitted for nuclei growth in the process of cooling and solidification becomes relatively longer, and sufficient crystallization growth can be obtained.

In the wavelength of an excimer laser beam, the laser beam can be absorbed into only the extreme top surface of a semiconductor layer, where the laser beam is converted to heat. For example, in the case of an XeCl excimer laser beam having a wavelength of 308 nm, almost all the laser beam can absorbed in an area 20 nm deep from the extreme top surface of a silicon layer. After that, the laser beam is thermally transmitted from this area to deeper inner silicon layers, whereby the entire silicon layer is annealed. That is, while the laser beam is being irradiated, the surface temperature of the silicon layer always becomes higher in comparison with the other areas. This can be easily presumed on the basis of the results of a thermal transmission simulation in laser annealing.

Herein, it is assumed that the energy, which is absorbed into a silicon layer and is thermally converted, in the case where a laser beam is irradiated from the surface of a substrate onto one side thereof is the same as that in the case where the laser beam is irradiated onto both the surface and the rear side thereof. FIG. 26 shows the results of simulations of the laser beam intensity distribution for one-sided irradiation and both-side irradiation in the depth direction of a silicon layer. In the case of both-side irradiation, a case is indicated where the ratio of the surface irradiation intensity to the rear side irradiation intensity is 3 to 1. As shown in FIG. 26, in the process of rising the temperature by irradiation by a laser beam, the areas that absorbs the laser beam and generates heat in the case of both-side irradiation will be two planes which are the surface side and the underground boundary side. That is, it is possible to effectively expand the heat-generating area. Therefore, in comparison with one-sided irradiation, abrasion will barely occur (it has been known that abrasion occurs if the laser energy density exceeds a specified level where an excimer laser beam is irradiated onto a semiconductor layer). That is, in the case of both-sided irradiation, it is possible to heat the semiconductor layer at an effectively high energy density without generating any abrasion on the semiconductor layer.

With the present invention, an island-like semiconductor layer can be formed as a mono-crystal area or an area which can be regarded as monocrystal by applying such a laser annealing method (dual beam laser annealing method), wherein it is possible to produce a semiconductor device having TFTs that have a structure responsive to the features or functions of respective circuits by using such an island-like semiconductor layer in the TFT active layer.

Therefore, in order to solve the abovementioned problems, a method for manufacturing a semiconductor device having a TFT provided on a substrate according to a first aspect of the invention is featured in comprising the steps of: forming an underground film in contact with one main surface of the substrate; forming an amorphous semiconductor layer on the underground film; forming an island-like semiconductor layer having a first shape from a semiconductor film having the amorphous semiconductor layer; irradiating a laser beam onto the surface opposed to the island-like semiconductor layer having the first shape of the substrate, and reflecting the laser beam, which comes from a peripheral area of the island-like semiconductor layer and has passed through the substrate, by a reflection plate secured at the side opposed to one main surface of the substrate, wherein an island-like semiconductor layer having a crystalline property is formed; removing a part overlapping at least a gate electrode or a part forming a channel forming region, of end parts of the island-like semiconductor layer having a crystalline property, by 1 $\mu$m or more from the end parts, and forming an island-like semiconductor layer having a second shape; forming a high concentration n-type impurity region or a high concentration p-type impurity region which is made into at least a channel forming region and a source region or a drain region on the island-like semiconductor layer having the second shape; and doping hydrogen to the island-like semiconductor layer having the second shape; and irradiating the laser beam from the surface of the substrate side of the island-like semiconductor layer; and irradiating the laser beam from the surface of the substrate side of the island-like semiconductor layer; wherein at least the channel forming region of the TFT has a mono-crystalline structure, and to which hydrogen is doped.

A method for manufacturing a semiconductor device having a TFT provided on a substrate according to another aspect of the invention is featured in comprising the steps of: forming an underground film in contact with one main surface of the substrate; forming an amorphous semiconductor layer on the underground film; forming an island-like semiconductor layer having a first shape from a semiconductor film having the amorphous semiconductor layer; introducing a catalyst element, which fosters crystallization of a semiconductor, to the island-like semiconductor layer having the first shape; irradiating a laser beam onto the surface opposed to the island-like semiconductor layer having the first shape of the substrate, and reflecting the laser beam, which comes from a peripheral area of the island-like semiconductor layer and has passed through the substrate, by a reflection plate secured at the side opposed to one main surface of the substrate, and irradiating the laser beam from the surface of the substrate side of the island-like semiconductor layer, wherein an island-like semiconductor layer having a crystalline property is formed; removing a part overlapping at least a gate electrode or a part forming a channel forming region, of end parts of the island-like semiconductor layer having a crystalline property, by 1 $\mu$m or more from the end parts, and forming an island-like semiconductor layer having a second shape; forming a high concentration n-type impurity region or a high concentration p-type impurity region which is made into at least a channel forming region and a source region or a drain region on the island-like semiconductor layer having the second shape;

and doping hydrogen to the island-like semiconductor layer having the second shape; wherein at least the channel forming region of the TFT has a mono-crystalline structure, and to which hydrogen is doped.

A method for manufacturing a semiconductor device having a TFT provided on a substrate according to still another aspect of the invention is featured in comprising the steps of: forming an underground film in contact with one main surface of the substrate; forming an amorphous semiconductor layer on the underground film; introducing a catalyst element, which fosters crystallization of a semiconductor, to the amorphous semiconductor layer; thermally processing the semiconductor layer having a crystalline property, and forming a semiconductor layer having a crystalline property; forming an island-like semiconductor layer having a first shape from a semiconductor film having the amorphous semiconductor layer; introducing a catalyst element, which fosters crystallization of a semiconductor, to the island-like semiconductor layer; irradiating a laser beam onto the surface opposed to the island-like semiconductor layer having the first shape of the substrate, and reflecting the laser beam, which comes from a peripheral area of the island-like semiconductor layer and has passed through the substrate, by a reflection plate secured at the side opposed to one main surface of the substrate, wherein an island-like semiconductor is crystallized; removing a part overlapping at least a gate electrode or a part forming a channel forming region, of end parts of the island-like semiconductor layer, by 1 µm or more from the end parts, and forming an island-like semiconductor layer having a second shape; forming a high concentration n-type impurity region or a high concentration p-type impurity region which is made into at least a channel forming region and a source region or a drain region on the island-like semiconductor layer having the second shape; and doping hydrogen to the island-like semiconductor layer having the second shape; wherein at least the channel forming region of the TFT has a mono-crystalline structure, and to which hydrogen is doped.

The construction of the present invention is applicable to a method for manufacturing a semiconductor device having a pixel TFT secured in a pixel portion and a drive circuit, in which a p-channel type TFT and an n-channel type TFT are provided around the corresponding pixel portion, on the same substrate.

MODE FOR CARRYING OUT THE INVENTION

[Embodiment Mode 1]

Figure 4A:
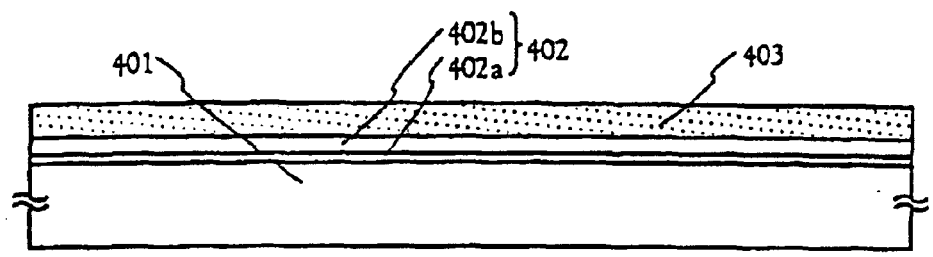
FIGS. 4A–4D are views explaining a process to produce an island-like semiconductor layer of Embodiment Mode 1.

A description is given of an embodiment mode of the invention with reference to FIGS. 4A–4D. In FIG. 4A, glass substrates made of non-alkali glass such as barium borosilicate glass and aluminum borosilicate glass, etc., are used as a substrate 401. For example, #7059 glass and #1737 glass group made by Corning may be preferably used. In addition thereof, plastic substrates not having optical anisotropy such as polyethylene terephthalate (PET), polyethylene naphthalate (PEN), polyether sulfon (PES), etc., may be used. In the case where a glass substrate is used, it is better that the glass substrate is thermally treated in advance at a lower temperature by 10 through 20° C. than the glass strain point. In order to prevent impurities from being diffused from the substrate

401, an underground film 402 such as a silicon oxide film, silicon nitride film or silicon oxide nitride film is formed in close contact with one main surface on which TFTs of the substrate 401 are formed. For example, a silicon oxide nitride film produced of $SiH_4$, $NH_3$, $N_2O$ by the plasma CVD method, is laminated and formed 10 through 200 nm deep (preferably, 50 through 100 nm deep), and similarly silicon oxide nitride hydroride film 402 produced of $SiH_4$, $N_2O$ is laminated and formed 50 through 200 nm deep (preferably 100 through 150 nm deep).

The silicon oxide nitride film is formed by using the conventional parallel plane type plasma CVD method. The silicon oxide nitride film 402*a* was produced in such conditions where $SiH_4$ of 10 SCCM, $NH_3$ of 100 SCCM, and $N_2O$ of 20 SCCM were introduced into a reaction chamber, wherein the substrate temperature was 325° C., the reaction pressure was 40 Pa, discharge power density was 0.41 $W/cm^2$, and discharge frequency was 60 MHz. On the other hand, the silicon oxide nitride hydroride film 402*b* was produced in such conditions where $SiH_4$ of 5 SCCM, $N_2O$ of 120 SCCM, $H_2$ of 125 SCCM were introduced into the reaction chamber, wherein the substrate temperature was 400° C., reaction pressure was 20 Pa, discharge power density was 0.41 $W/cm^2$, and discharge frequency was 60 MHz. These films can be continuously formed by only changing the reaction gases while varying the substrate temperature. If such an underground film is formed so that the internal stress has a tensile stress with respect to the substrate, this is preferable in view of stabilizing the threshold voltage (Vth). Also, it is favorable that the internal stress does not change in the thermal processing at 400 through 600° C.

A silicon oxide nitride film 402*a* thus constructed has a density of $9.28 \times 10^{22}/cm^3$, and it is an elaborate and hard film in which at 20° C. a blended solution (Brandname: LAL500 made by Stera Chemipha Corporation) containing ammonium bifluoride ($NH_4HF_2$) at 7.13% and ammonium fluoride at 15.4%, the etching rate is slow (approx. 63 nm per minute). If such a film is used for the underground film, it is effective in preventing alkali metal elements, which come from a glass substrate, from being diffused onto the semiconductor layer formed thereon.

Next, an amorphous semiconductor layer 403 having an amorphous structure is formed to be 25 through 80 nm deep (preferably, 30 through 60 nm deep) by a publicly known method such as the plasma CVD method or sputtering method, etc. For example, an amorphous silicon film is formed to be 55 nm thick by the plasma CVD method. There are an amorphous semiconductor layer and a microcrystalline semiconductor film as the semiconductor film having an amorphous structure. It is better that a chemical compound semiconductor film having an amorphous structure such as an amorphous silicon germanium film is applied. In addition, it is possible to continuously form both the underground film 102 and the amorphous semiconductor layer 403. For example, as described above, if the reaction gases are changed from $SiH_4$, $N_2O$, and $H_2$ to $SiH_4$ and $H_2$ or to only $SiH_4$ after the silicon oxide nitride film 402*a* and silicon oxide nitride hydroride film 402*b* are continuously molded by the plasma CVD method, they may be continuously molded without being exposed to the atmosphere at all. As a result, contamination on the surface of the silicon oxide nitride hydroride film 402*b* can be prevented, whereby it is possible to decrease unevenness in the properties of produced TFTs, and fluctuations of the threshold voltage.

Figure 4B:
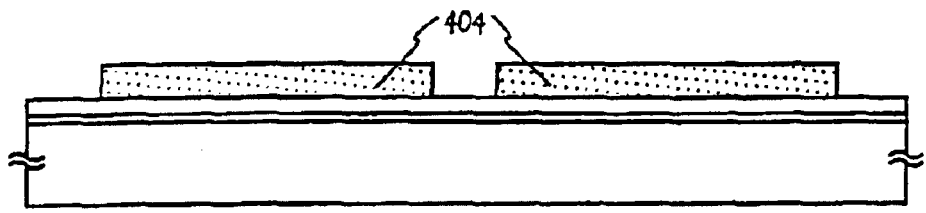

And, as shown in FIG. 4B, an island-like semiconductor layer 404 having the first shape is formed from the amorphous semiconductor layer 403. Although the first shape may be square, rectangular, or optionally polygonal, the shape may be formed so that the distance from the center portion to the end portion has an area of 50 μm or less. This value is limited in terms of effective crystallization by making a laser beam incident from peripheral areas of the island-like semiconductor layer 404 into a substrate and again making the laser beam, which is reflected by a reflection plate positioned under the substrate, incident into a plane of the substrate side of the island-like semiconductor layer 404. If one side exceeds this value, it becomes difficult for the reflected laser beam to enter the interior of the island-like semiconductor layer 404, whereby crystallization is not preferably carried out.

Figure 1:
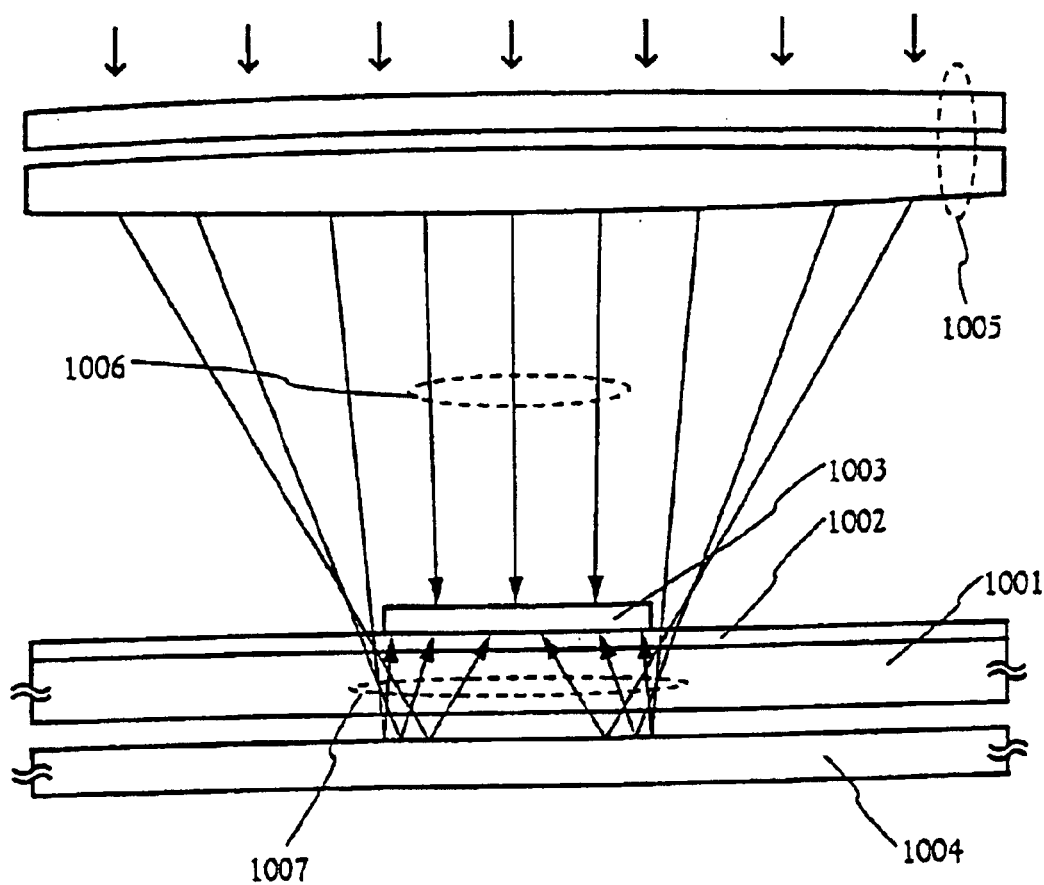
FIG. 1 is a view explaining the concept of a laser annealing method of the present invention.
Figure 2A:
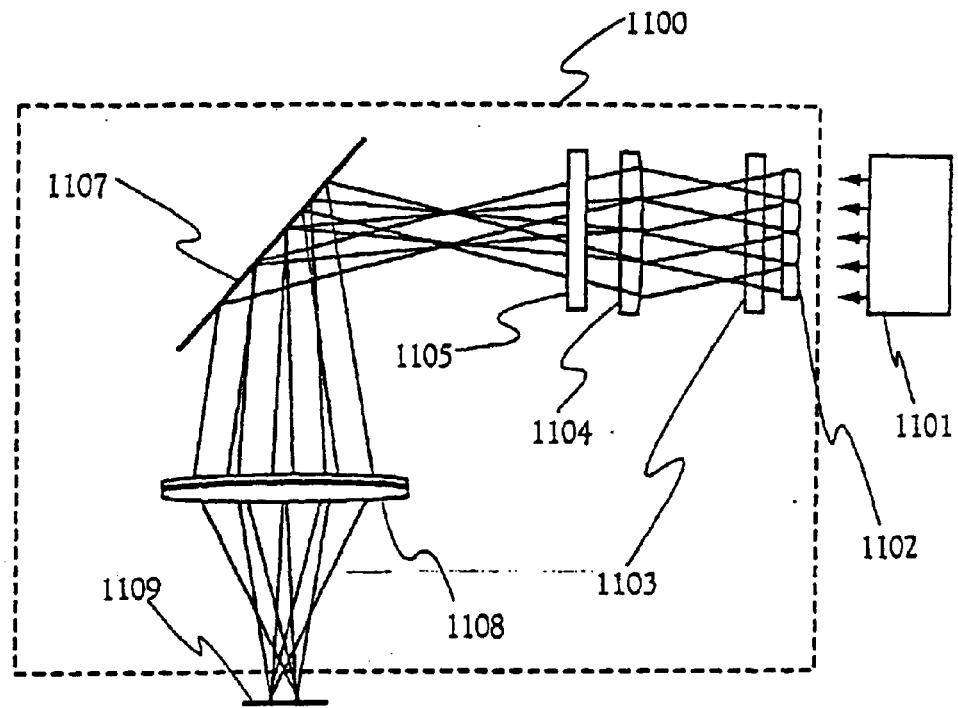
FIGS. 2A–2B are views explaining a construction of an optical system of a laser annealing apparatus of the present invention.
Figure 2B:
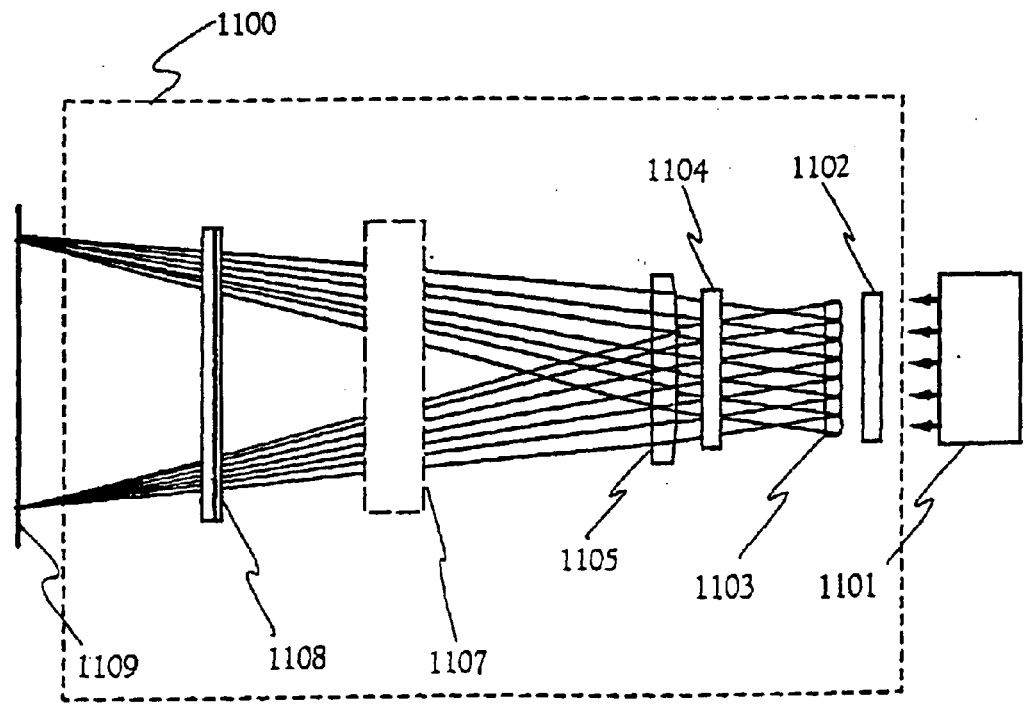
Figure 3A:
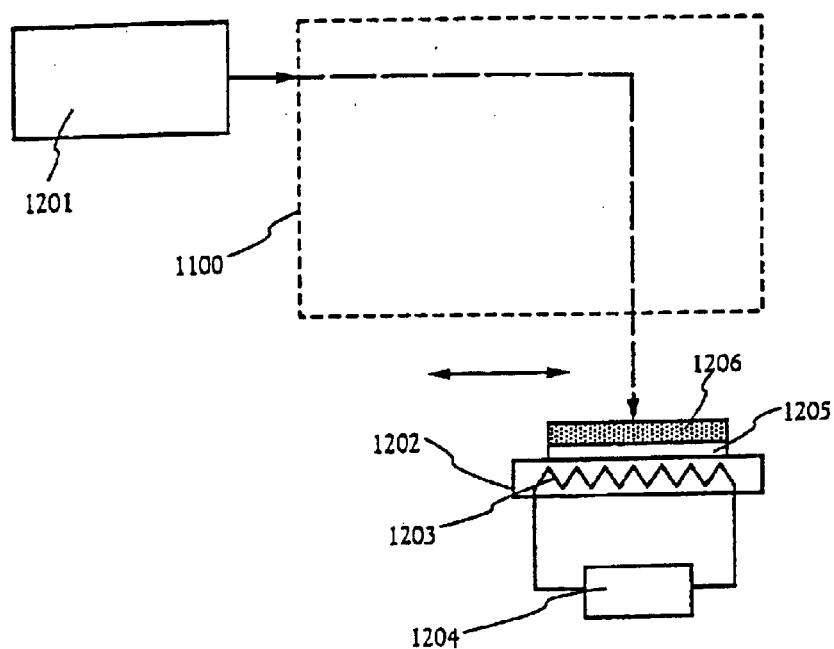
FIGS. 3A–3B are views explaining a construction of an optical system of a laser annealing apparatus of the present invention.
Figure 3B:
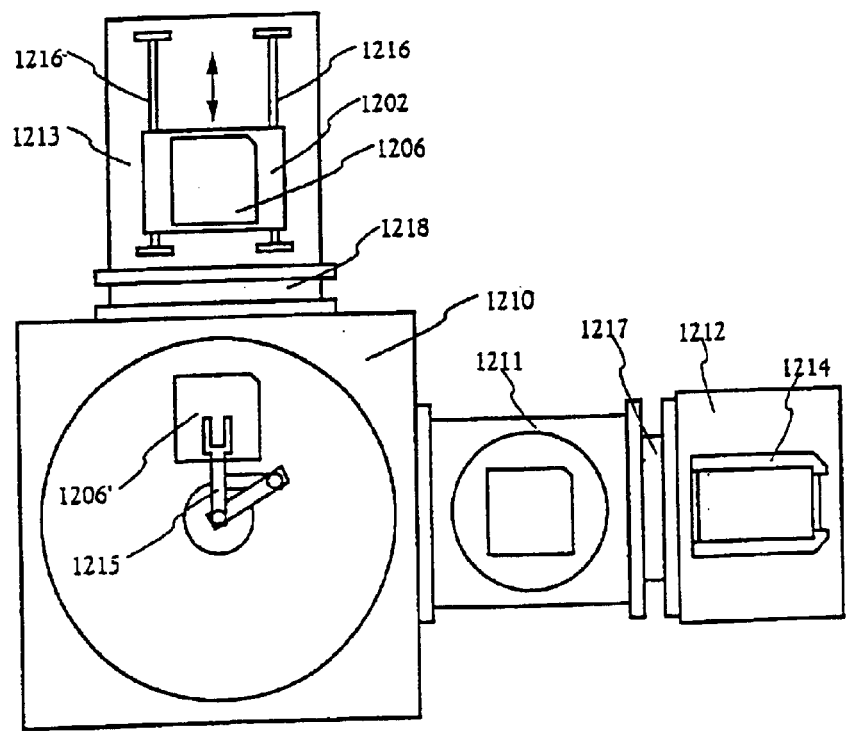
Figure 4C:
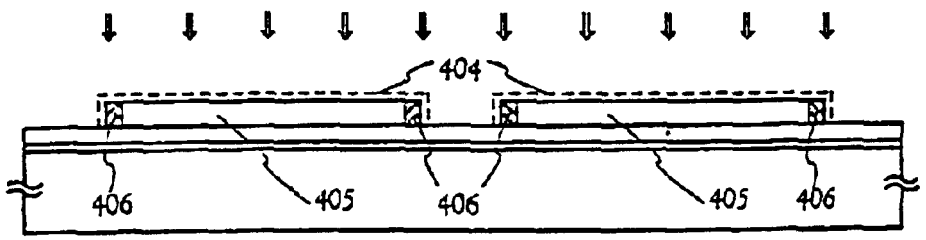

Next, as shown in FIG. 4C, crystallization is carried out by the laser annealing method. With respect to the crystallization, first, it is preferable that hydrogen contained in the amorphous layer is emitted, and it is better that thermal processing is performed at a temperature from 400 through 500° C. for approx. one hour to reduce the hydrogen content thereof to 5 atomic % or less. The laser annealing method uses a pulse oscillation type or continuous oscillation type excimer laser and argon laser as the light source. The configuration and concept of the apparatus may be the same as those described in reference to FIG. 1 and FIGS. 3A–3B as described above.

Although the laser annealing conditions are adequately selected and determined by a practitioner, for example, a linear laser beam having a linear width of 100 through 1000 μm, for example, 400 μm, is irradiated where, for example, the pulse oscillation frequency of the excimer laser is 30 Hz, the laser energy density is 100 through 500 $mJ/cm^2$ (representatively, 300 through 350 $mJ/cm^2$). Since the linear width is greater than the island-like semiconductor layer 404, it is possible to irradiate the entire surface opposed to the substrate side of at least one island-like semiconductor layer 404 and the surrounding of the island-like semiconductor layer 404 with a one pulse linear beam. A part of the beam irradiated at an incident angle θ in the peripheries of the island-like semiconductor layer 404, reaches the reflection plate at the lower side of the substrate, wherein a part of the beam reflected at a reflection angle θ' is irradiated onto the surface of the island-like semiconductor layer 404 at the substrate side. Also, the irradiation may be performed several times while scanning with the linear beam. It is preferable that the overlapping ratio of the linear beam at this time is 50 through 98%. In reality, it is better to set the number of irradiation pulses to 20 through 40 pulses. Similar treatment can be performed even though the shape of the laser beam is like a plane.

Thus, in the laser annealing method, the beam irradiated at an incident angle θ in the peripheries of the island-like semiconductor layer 404 is attenuated to approx. 50% in the process of passing through the substrate 401. Even though the positive reflectivity of the reflection plate is 90%, the laser beam irradiated on the surface of the substrate side of the island-like semiconductor layer 404 is considered to be 15 through 30% of the direct laser beam. However, the island-like semiconductor layer 404 can be sufficiently heated with a diffused laser beam of such intensity. As a result, the cooling process of the semiconductor layer melted by a direct laser beam and a diffused laser beam is slowed, whereby it is possible to sufficiently achieve crystallization growth.

Although the substrate can be heated to 100 through 450° C. by a heater 1203 secured at a stage 1202 shown in FIG. 3A, heating of the semiconductor layer by the diffused laser beam is more effective than this temperature.

In order to make the diffused laser beam incident into the inside of the island-like semiconductor layer 403, the reflection plate 1205 is made of aluminum, and several hundreds of minute projections and dents are formed on the surface to determine the diffusion reflection ratio to 50 through 70%. This is effective. This is because the surface having minute projections and dents increases a scattering angle of a laser beam.

Figure 4D:
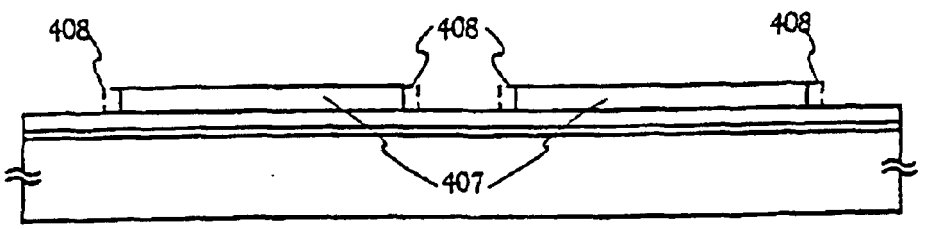

Based on the results of having thus applied laser annealing, as shown in FIG. 4C, the island-like semiconductor layer 404 is made denser and denser in the transition from an amorphous structure to a crystallized structure, wherein the layer is contracted by 1 through 15% (The dotted lines in the drawing indicate the size of the island-like semiconductor layer before annealing). And, an island-like semiconductor layer 405 having a crystallized structure is formed. An area 406, in which stress due to contraction, are accumulated in the peripheries of the island-like semiconductor layer 405, is created. Since the area 406 in which the stress is accumulated has a number of defect levels such as the capture center, re-coupling center, etc., it is not suitable to use the area 406 as at least TFT channel forming regions. Therefore, Japanese Laid-Open Patent Publication No. 8-228006 discloses a technology to form an island-like semiconductor layer having a new shape by removing such an area where stresses have accumulated at the peripheries of such island-like semiconductor layers. Accordingly, as shown in FIG. 4D, an island-like semiconductor layer 407 is formed by etching and removing the area 406 where stresses have accumulated (408 indicated with the dotted lines in the drawing expresses the area removed by etching).

Thereafter, the island-like semiconductor layer 407 is thermally processed at a temperature of 300 through 450° C. in an atmosphere containing hydrogen at a ratio from 3 through 100%, or thermally processed at a temperature from 200 through 450° C. in an atmosphere containing hydrogen generated by plasma, and the residual defects can be neutralized. The island-like semiconductor layer 407 thus constructed can be preferably used as an active layer of TFTs.
[Embodiment Mode 2]

Figure 5A:
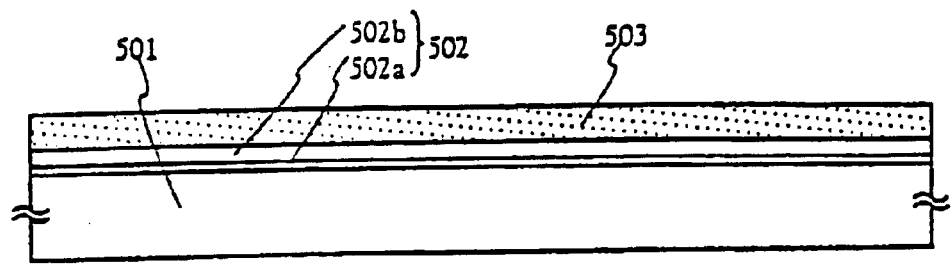
FIGS. 5A–5D are views explaining a process to produce an island-like semiconductor layer of Embodiment Mode 2.
Figure 5B:
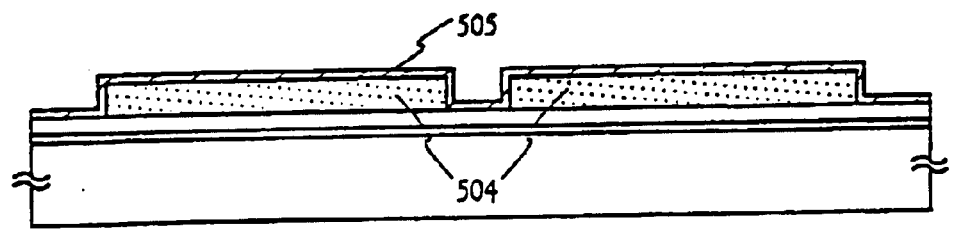
Figure 5C:
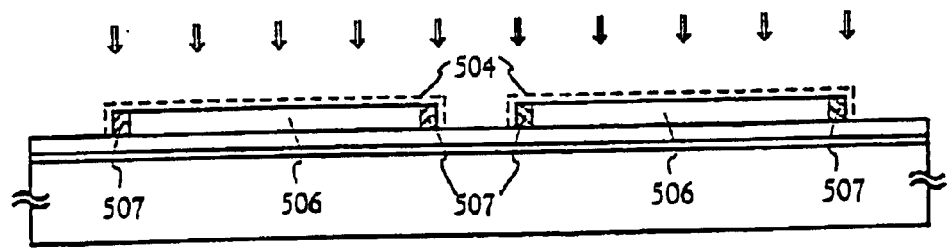

A description is given of another embodiment mode of the invention with reference to FIGS. 5A–5D. In FIG. 5A, a substrate 501, underground film 502, and amorphous semiconductor layer 503 are produced as in the first embodiment mode. And, as shown in FIG. 5B, an island-like semiconductor layer 504 having the first shape is formed from the amorphous semiconductor layer 503. And, a layer 505 containing a catalytic element is formed by coating a water solution including a catalytic element at a ratio of 5 through 100 ppm in weight by the spin-coat method. The catalytic element may be nickel (Ni), germanium (Ge), iron (Fe), palladium (Pd), tin (Sn), lead (Pb), cobalt (Co), platinum (Pt), copper (Cu), gold (Au), etc. In the layer 505 containing the catalytic element, the catalytic element layer may be formed to be 1 through 5 nm thick by the spin-coat method, sputtering method, or vacuum metallizing method.

Figure 5D:
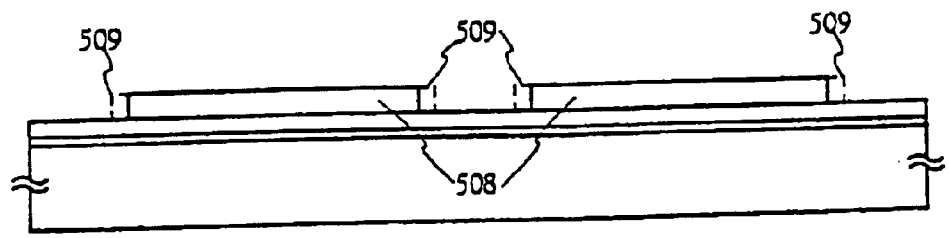

Laser annealing is applied onto the substrate in this state as in the first embodiment mode. As a result, a catalytic element is contained, at a concentration of $1\times10^{17}$ through $1\times10^{19}$ atoms/cm$^3$, in the island-like semiconductor layer 506, having a crystallized structure, which is formed via a state where it is once melted by a direct laser beam or a diffused laser beam. The catalytic element is diffused in crystallization while forming silicide in the semiconductor layer, and in the process, the catalytic element has an effect to foster the crystallization of the semiconductor layer. In comparison with the first embodiment mode, it becomes possible to form a crystalline semiconductor layer having a higher crystalline property. However, in this case, the island-like semiconductor layer 506 is made denser and is contracted in the transition from an amorphous structure to a crystallized structure (the dotted lines in the drawing indicates the size of the island-like semiconductor layer before annealing). Therefore, portions 507 where stresses have accumulated due to contraction is produced in the peripheries of the island-like semiconductor layer 506. Therefore, also in this case, as shown in FIG. 5D, the portions 507 where stress have been accumulated is etched and removed to form an island-like semiconductor layer 508 having the second shape (The dotted lines in the drawing indicates an area removed by the etching).

Thereafter, the island-like semiconductor layer 508 is thermally processed at a temperature of 300 through 450° C. in an atmosphere containing hydrogen at a ratio from 3 through 100%, or thermally processed at a temperature from 200 through 450° C. in an atmosphere containing hydrogen generated by plasma, and the residual defects can be neutralized. The island-like semiconductor layer 508 thus constructed can be preferably used as an active layer of TFTs.
[Embodiment Mode 3]

An island-like semiconductor layer having a crystallized structure which is used as an active layer of TFTs is produced by not only the laser annealing method but also a combination of the laser annealing method according to the invention and a thermal annealing method. In particular, crystallization by the thermal annealing method is applied to a crystallization method using a catalytic element, which is disclosed by Japanese Laid-Open Patent Application No. 7-130652, crystallization can be achieved at a temperature of 600° C. or less. If a crystalline semiconductor layer thus produced is processed by the laser annealing method according to the invention, a high quality crystalline semiconductor layer can be obtained. A description is given of such an embodiment with reference to FIGS. 6A–6D.

Figure 6A:
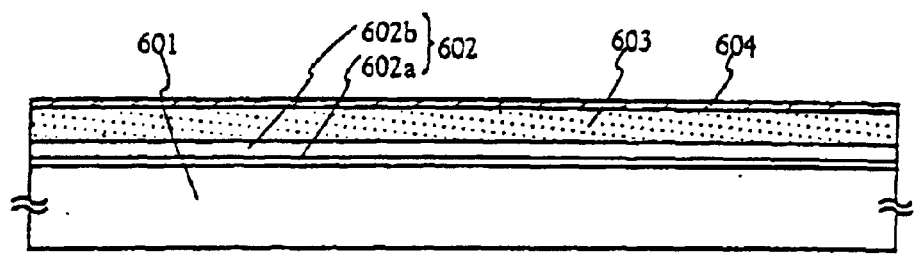
FIGS. 6A–6D are views explaining a process to produce an island-like semiconductor layer of Embodiment Mode 3.
Figure 6B:
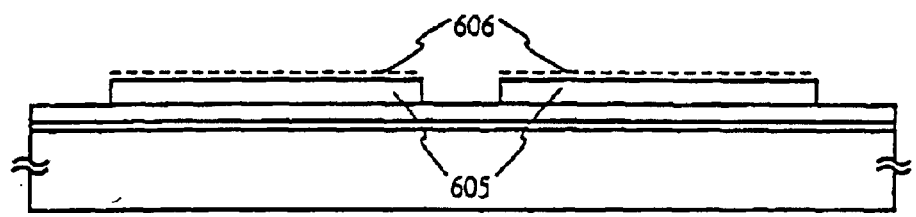
Figure 6C:
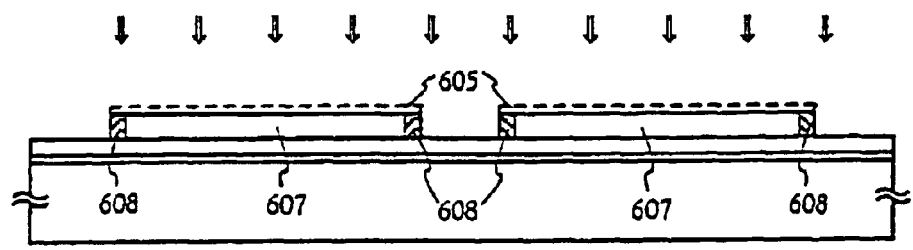

In FIG. 6A, a glass substrate shown in the first embodiment mode may be preferably used for a substrate 601. In addition thereto, the underground film 602 and amorphous semiconductor layer 603 may be produced as in the first embodiment. And, as in the second embodiment mode in this state, a layer 604 containing a catalytic element is formed on the amorphous semiconductor layer 603. After that, thermal processing is carried out for approx. one hour at a temperature of 400 through 500° C. to decrease the amount of hydrogen contained in the amorphous semiconductor layer to 5 atomic % or less. Subsequently, using an annealing furnace, thermal annealing is carried out at a temperature of 550 through 600° C. for one through eight hours in a nitrogen atmosphere, preferably, at a temperature of 550° C. for four hours. Through the above-mentioned processes, it is possible to obtain a crystallized semiconductor layer (not illustrated) consisting of a crystallized silicon layer. When the crystallized semiconductor layer produced by the thermal annealing method is macroscopically observed by an optical microscope, there are cases where amorphous areas remain locally. In such cases, as in the Raman spectroscopy, amorphous constituents having a broad peak at 480 cm$^{-1}$ can be observed. But, such amorphous areas can be easily removed by the laser annealing method according to the invention, and a good quality crystallized semiconductor layer can be obtained.

Therefore, an island-like semiconductor layer 605 having the first shape is formed from the crystallized semiconductor layer to which the abovementioned thermal annealing is applied. As the crystallized semiconductor layer is made denser and contracted in the transition from an amorphous structure to a crystallized structure, the film thickness becomes thinner by 1 through 15% than the thickness (indicated by dotted line 606 in the drawing) of the amorphous semiconductor layer 603 (See FIG. 6B).

Figure 6D:
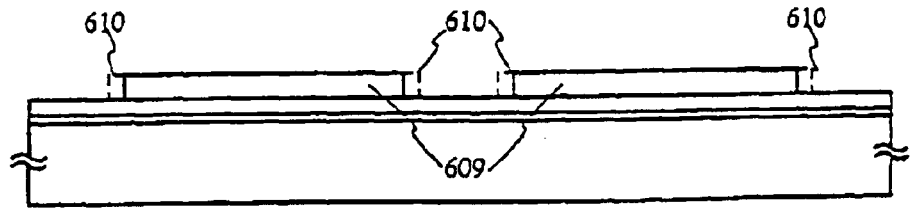

Laser annealing is applied to the substrate in this state as in the first embodiment. As a result, an island-like semiconductor layer 607 having a crystallized structure can be newly formed via a state where it is melted by a direct laser beam or a diffused laser beam. In this case, the island-like semiconductor layer 605 is made slightly denser in line with an increase in the crystalline property and is contracted (the dotted lines in the drawing indicate the size of the island-like semiconductor layer 605 before the annealing). Therefore, an area where stress due to contraction are accumulated is produced in the peripheries of the island-like semiconductor layer 607. Also, a catalytic element is contained at a concentration of $1 \times 10^{17}$ through $1 \times 10^{19}$ atoms per cubic centimeter in the island-like semiconductor layer 607. Also in this case, as shown in FIG. 6D, the area 608 where stresses are accumulated is etched and removed, whereby an island-like semiconductor layer 609 having the second shape can be formed (610 indicated by the dotted line in the drawing indicates an area which is removed by etching).

Thereafter, an island-like semiconductor layer 609 is thermally processed at a temperature of 300 through 450° C. in an atmosphere containing hydrogen at a ratio from 3 through 100%, or thermally processed at a temperature from 200 through 450° C. in an atmosphere containing hydrogen generated by plasma.

[Embodiment Mode 4]

Figure 7A:
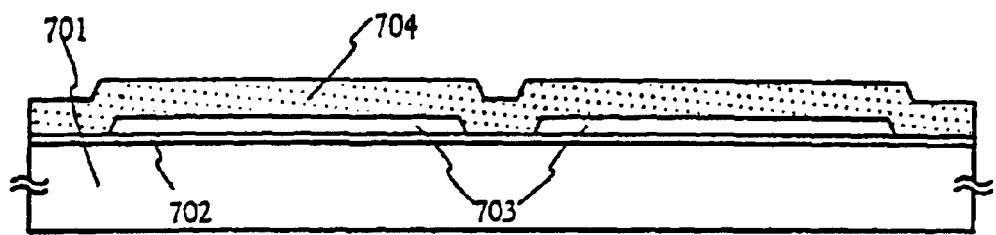
FIGS. 7A–7D are views explaining a process to produce an island-like semiconductor layer of Embodiment Mode 4.
Figure 7B:
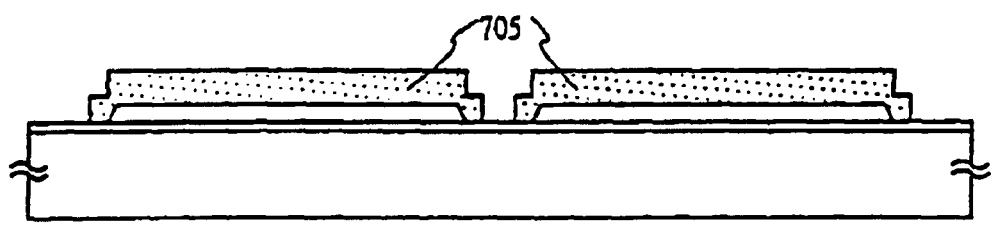

An embodiment described with reference to FIGS. 7A–7B is a method for forming a better quality crystallized semiconductor layer by crystallizing the semiconductor layer with a temperature slope by the laser annealing method. In FIG. 7A, a substrate 701 may be the same as that used in the first embodiment mode.

A thermally conductive layer 702, having a light transmission property and an insulation property, which is excellent in thermal conductivity, is formed on the surface on which TFTs of the substrate 701 are formed. It is necessary that the thermally conductive layer 702 is made 50 through 500 nm thick and that the thermal conductivity is 10 $Wm^{-1}K^{-1}$ or more. An oxide of aluminum (Aluminum oxide ($Al_2O_3$) is suitable as this type of material because it has light transmission properties for a visible light and its thermal conductivity is 20 $Wm^{-1}K^{-1}$. Also, the aluminum oxide is not limited to the stoichiometric ratio, but other elements may be doped in order to control the thermally conductive characteristics and other characteristics such as an internal stress, etc. For example, nitrogen is blended to the aluminum oxide, whereby an aluminum oxide nitride ($AlN_xO_{1-x}$:0.02≦X≦0.5) may be used, or aluminum nitride ($AlN_x$) may be used. In addition, a compound containing silicon (Si), oxygen (O), nitrogen (N), M(M is at least one element selected from aluminum (Al) and rare metal elements) may be used. For example, AlSiON and LaSiON, etc., may be preferably used. In addition thereto, boron nitride, etc. may be used. Any one of the abovementioned oxides, nitrides, and compounds may be formed by the sputtering method. These can be formed by sputtering, using an inactive gas such as argon (Ar) and nitrogen, by using a target of an appointed composition. Also, a thin film diamond layer and DLC (Diamond-like carbon) layer whose thermal conductivity reaches 1,000 $Wm^{-1}K^{-1}$ may be provided.

An island-like insulation layer 703 is formed thereon. A material whose thermal conductivity is 10 $Wm^{-1}K^{-1}$ or less in the island-like insulation layer 703 is used. As such a material, a silicon oxide film or a silicon nitride film may be selected, but preferably, it is better that the island-like insulation layer 703 may be composed of a silicon oxide nitride film. The silicon oxide nitride may be produced by the plasma CVD method, using $SiH_4$ and $N_2O$ as the material gas. $O_2$ may be doped onto the material gas. The production conditions are not limited, but for the island-like insulation layer 703, the silicon oxide nitride is made 50 through 500 nm thick, the oxygen content ratio is made higher than 55 atomic % but lower than 70 atomic %, and the nitrogen content ratio is made higher than 1 atom % but lower than 20 atomic %. That is, the island-like insulation layer 703 is composed as described above, wherein the internal stress of the silicon oxide nitride film is decreased, and the fixed charge density is reduced.

Next, a semiconductor film 704 having an amorphous structure is produced to be 25 through 80 nm thick (preferably, 30 through 60 nm thick) by a publicly known method such as the plasma CVD method, sputtering method, etc. For example, an amorphous silicon film is formed to be 55 nm thick by the plasma CVD method. For a semiconductor having an amorphous structure, there is an amorphous semiconductor layer, and a microcrystalline semiconductor film, and a compound semiconductor film having an amorphous structure such as an amorphous silicon germanium film, etc., may be applied. Thereafter, an island-like semiconductor layer 705 having the first shape is formed from the semiconductor film 704 having an amorphous structure. The island-like semiconductor layer 705 may be formed so that it covers the island-like insulation layer 704 and its end portions are brought into contact with the thermally conductive layer 702. (See FIG. 6B).

And, using the dual beam laser annealing method, the island-like semiconductor layer 705 is crystallized. In the process, by cooling down an area where the end portions of the island-like semiconductor layer 705 are brought into contact with the thermally conductive layer 702 suddenly, crystalline nuclei are generated first in the area. Minute crystallized grains are formed in the area. On the other hand, temperature fluctuations when heating and cooling become comparatively mild for the island-like semiconductor layer existing on the island-like insulation layer 703. And, on the semiconductor layer existing in the area, crystallized grains are caused to grow considerably slowly from the end portions nearer to the thermally conductive layer 702, and singular crystallized grains are caused to grow on the entire surface on the island-like insulation layer 703.

Figure 7C:
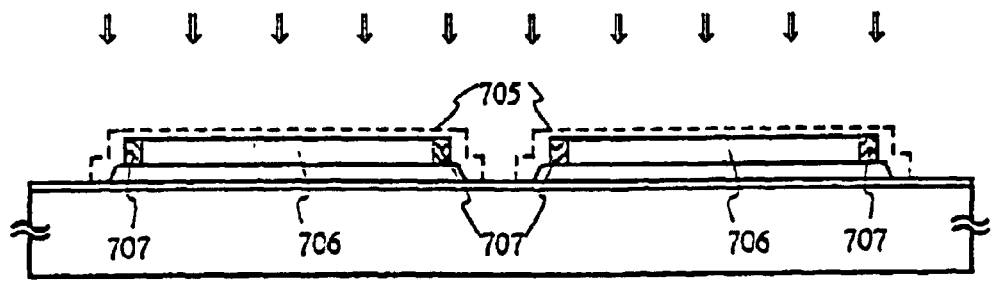
Figure 7D:
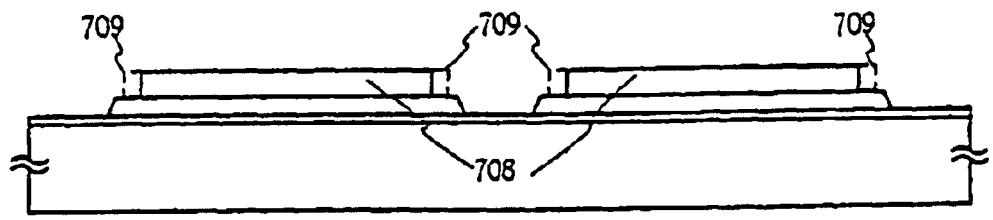

As a result, as shown in FIG. 7C, the island-like semiconductor layer 705 is made denser by transition from an amorphous structure to a crystallized structure, and is contracted by 1 through 15% (The dotted lines in the drawing indicate the size of the island-like semiconductor layer before annealing), wherein an island-like semiconductor layer 706 having a crystallized structure is formed. Portions 707 where stresses due to contraction have accumulated in the peripheries of the island-like semiconductor layer 706 is produced. Since there are a number of defect levels such as capturing centers and re-coupling centers in the portions 707 where the stresses have accumulated, such an area is not suitable if it is used for at least the channel forming region of TFTs. Finally, as shown in FIG. 7D, the portions 707 where stresses have accumulated is removed by etching, whereby an island-like semiconductor layer 708 having the second shape is formed. (709 shown by the dotted line in the drawing indicates the area removed by etching).

After that, the island-like semiconductor layer 708 may be thermally processed at a temperature of 300 through 450° C.

in an atmosphere containing hydrogen at a ratio from 3 through 100%, or thermally processed at a temperature from 200 through 450° C. in an atmosphere containing hydrogen generated by plasma. As described above, in this embodiment mode, such an example is referred to, in which a method for providing a thermally conductive layer on the underground film and utilizing a temperature slope of a semiconductor layer is applied to the laser annealing method described in the first embodiment mode. The method may be carried out in combination with the second embodiment mode or the third embodiment mode.

EXAMPLE 1

An example of the invention is described with reference to FIG. 8A through FIG. 10C. Herein, a description is given, of a method for simultaneously producing a pixel TFT of a pixel portion and a holding capacitance, an n-channel type TFT and a p-channel type TFT of the drive circuit provided at the peripheries of the pixel portion.

Figure 8A:
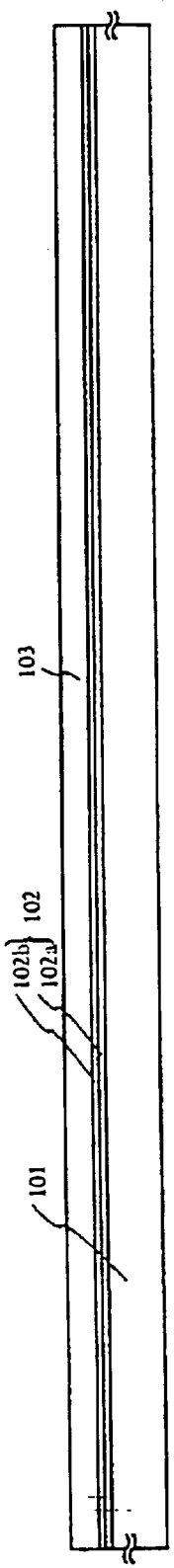
FIGS. 8A–8E are cross-sectional views showing a process to produce a pixel TFT and a drive circuit TFT of Example 1.

In FIG. 8A, as the substrate 101, a glass substrate such as barium borosilicate glass and aluminum borosilicate glass represented by #7059 glass and #1737 glass group made by Corning Corporation, may be used, and in the case where processes of crystallization and activation are carried out by only the laser annealing method, plastic substrates not having optical anisotropy such as polyethylene terephthalate (PET), polyethylene naphthalate (PEN), polyether sulfon (PES), etc., may be used in addition thereto. In the case where a glass substrate is used, it is better that the glass substrate is thermally treated in advance at a lower temperature by 10 through 20° C. than the glass stress point. In order to prevent impurities from being diffused from the substrate 101, an underground film 102 such as a silicon oxide film, silicon nitride film or silicon oxide nitride film is formed on the surface on which TFTs of the substrate 101 are formed. For example, a silicon oxide nitride film 102a produced of $SiH_4$, $NH_3$, $N_2O$ by the plasma CVD method, is laminated and formed 10 through 200 nm deep (preferably, 50 through 100 nm deep), and similarly silicon oxide nitride hydroride film 102b produced of $SiH_4$ and $N_2O$ is laminated and formed 50 through 200 nm deep. (preferably 100 through 150 nm deep).

The silicon oxide nitride film is formed by using the conventional parallel plane type plasma CVD method. The silicon oxide nitride film 102a was produced in such conditions where $SiH_4$ of 10 SCCM, $NH_3$ of 100 SCCM, and $N_2O$ of 20 SCCM were introduced into a reaction chamber, the substrate temperature was 325° C., the reaction pressure was 40 Pa, discharge power density was 0.41 W/cm$^2$, and discharge frequency was 60 MHz. On the other hand, the silicon oxide nitride hydroride film 102b was produced in such conditions where $SiH_4$ of 5 SCCM, $N_2O$ of 120 SCCM, $H_2$ of 125 SCCM were introduced into the reaction chamber, the substrate temperature was 400° C., reaction pressure was 20 Pa, discharge power density was 0.41 W/cm$^2$, and discharge frequency was 60 MHz. These films can be continuously formed by only changing the reaction gases while varying the substrate temperature.

Also, the silicon oxide nitride film 102a is formed so that the internal stress is made into a tensile force, based on the substrate. The silicon oxide nitride hydroride film 102b is caused to have an internal stress in a similar direction. However, the absolute value of the film 102b is made smaller than that of the layer 102a.

Next, a semiconductor layer 103 having an amorphous structure is formed to be 25 through 80 nm thick (preferably, 30 through 60 nm thick) by a publicly known method such as the plasma CVD method or sputtering method, etc. For example, an amorphous silicon film is formed to be 55 nm thick by the plasma CVD method. There is an amorphous semiconductor layer and a microcrystalline semiconductor film for the semiconductor film having an amorphous structure. A chemical compound semiconductor film having an amorphous structure such as an amorphous silicon germanium film may applied. In addition, it is possible to continuously form both the underground film 102 and the amorphous semiconductor layer 103. For example, as described above, if the reaction gases are changed from $SiH_4$, $N_2O$, and $H_2$ to $SiH_4$ and $H_2$ or to only $SiH_4$ after the silicon oxide nitride film 102a and silicon oxide nitride hydroride film 102b are continuously molded by the plasma CVD method, they may be continuously molded without being exposed to the atmosphere at all. As a result, contamination on the surface of the silicon oxide nitride hydroride film 102b can be prevented, whereby it is possible to decrease unevenness in the properties of produced TFTs, and fluctuations of the threshold voltage.

Figure 8B:
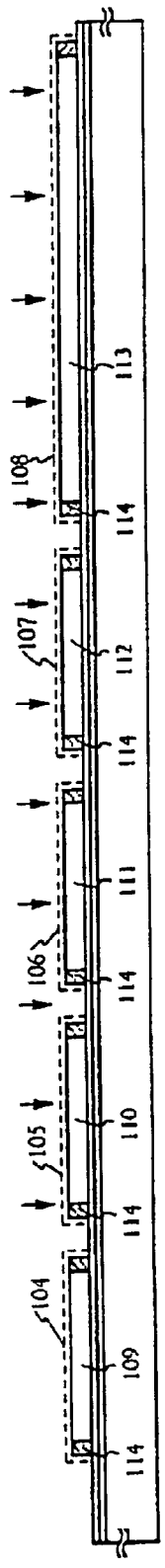
Figure 11A:
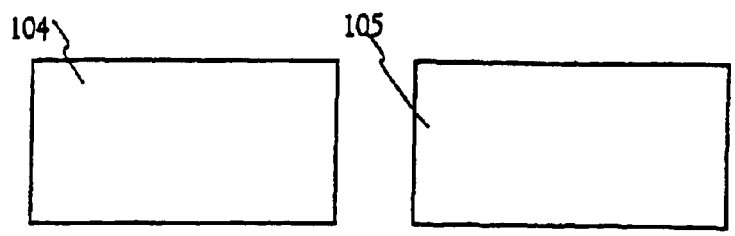
FIGS. 11A–11E are upper plan views showing a process to produce a drive circuit TFT of Example 1.
Figure 11B:
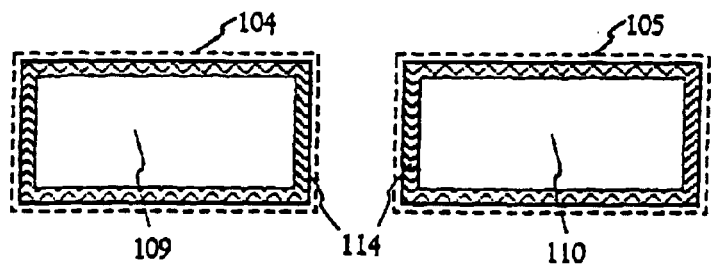
Figure 11C:
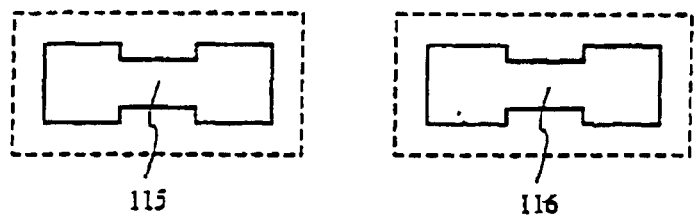
Figure 11D:
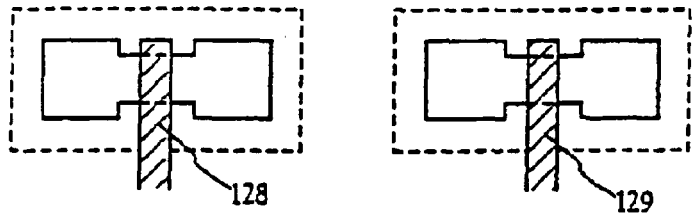

And, as shown in FIG. 8B, island-like semiconductor layers 104 through 108 having the first shape are formed from the semiconductor layer 103 having the amorphous structure. FIG. 11A is an upper plan view of the island-like semiconductor layers 104 and 105 in this state. FIG. 12A is an upper plan view of the island-like semiconductor layer 108. In FIGS. 11A–11E and FIGS. 12A–12D, although the island-like semiconductor layers are formed so that the length of one side of a rectangle thereof becomes 50 µm or less, the island-like semiconductor layers may be formed to any optional shape, and preferably the shape may be any type of polygon or circle as far as the minimum distance from the center portion to the end portion is 50 µm or less.

Figure 12A:
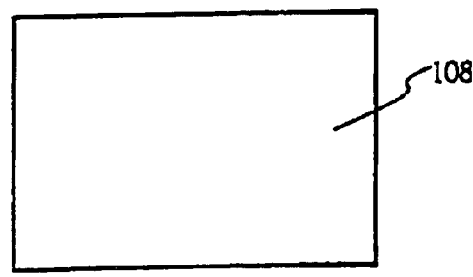
FIGS. 12A–12E are upper plan views showing a process to produce a pixel TFT of Example 1.
Figure 12B:
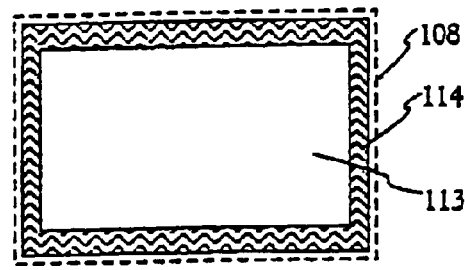

Next, a crystallization process is applied to such island-like semiconductor layers 104 through 108. Any one of the methods described with reference to the first through the fourth embodiment mode may be employed as the crystallization process. In either case, by applying the dual beam laser annealing method according to the invention, island-like semiconductor layers 109 through 113 composed of a crystalline silicon film, shown by the dotted lines in FIG. 8B are newly produced. Also, in this case, the films are made denser in line with crystallization of the amorphous silicon film and is caused to contract by 1 through 15%. Therefore, the island-like semiconductor layers consisting of such crystallized silicon film has a tensile stress when regarding the substrate as the center. In addition, an area where stresses have accumulated due to contraction is formed in the peripheries of the island-like semiconductor layers 109 through 113. FIG. 11B and FIG. 12B, respectively, are upper plan views showing the island-like semiconductor layers 109, 110 and 113 in this state. The areas 104, 105 and 108 shown by the dotted lines in the drawings indicate the size of the island-like semiconductor layers 104, 105 and 108 originally disposed there.

Figure 8C:
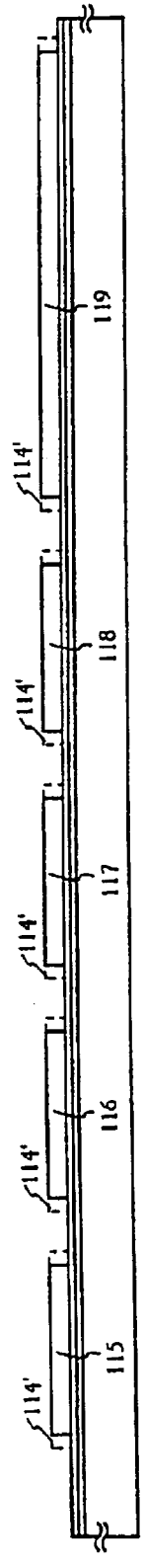
Figure 8D:
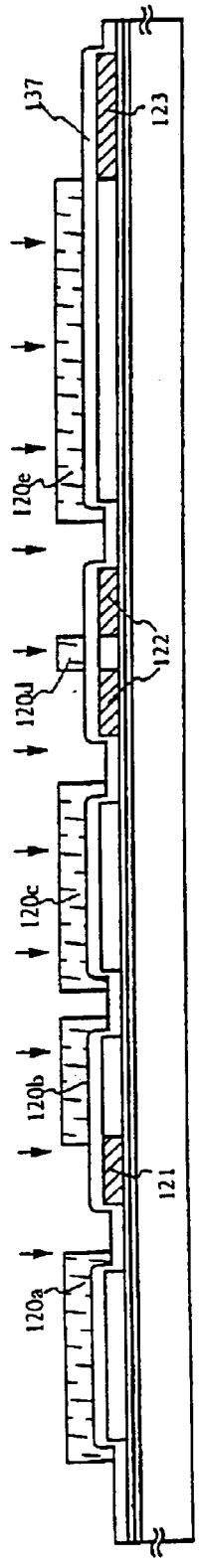
Figure 12C:
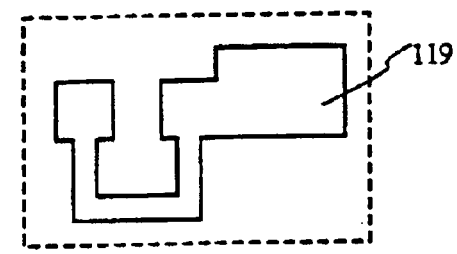

If a TFT gate electrode is formed bridging the area 114 in which such stresses have accumulated, as described above, there are a number of defect levels, and crystallization is not sufficient, resulting in deterioration of the TFT characteristics. For example, the OFF current value (the value of current flowing when the TFT is turned OFF) is increased, and the current is centralized at the area that will be locally heated. Therefore, as shown in FIG. 8C, the semiconductor layers 115 through 119 having the second shape are formed so that the area 114 in which stresses have accumulated are removed. 114' shown by the dotted line in the drawing indicates the area in which the area 114 having strains accumulated existed. It is shown that the island-like semiconductor layers 115 through 119 having the second shape are formed inwardly of the area 114'. The island-like semiconductor layers 115 through 119 having the second shape maybe formed to any optional shape. FIG. 11C is an upper plan view of the island-like semiconductor layers 115 and 116 in this state. Also, FIG. 12C shows an upper plan view of the island-like semiconductor layer 119.

Thereafter, a mask layer 137 made by a silicon oxide film 50 through 100 nm thick is formed by the plasma CVD method and sputtering method so as to cover the island-like semiconductor layers 115 through 119.

In this state, an impurity element to dope a p-type may be added onto the entire surface of the island-like semiconductor layers at a concentration of $1 \times 10^{16}$ through $5 \times 10^{17}$ atoms/cm$^3$ for the purpose of controlling the threshold voltage (Vth) of the TFTs. As impurity elements to dope the p-type onto semiconductors, there have been known the elements in Group 13 of the periodic table such as boron (B), aluminum (Al), gallium (Ga), etc. As the method, an ion implantation method and ion doping method may be used. However, the ion doping method is more suitable to process a large area substrate. In the ion doping method, diborane (B$_2$H$_6$) is used as a source gas, and boron (B) is added thereto. Implantation of such an impurity element is not necessarily required. It may be omitted as a matter of course. But, particularly, this method is preferably employed to keep the threshold voltage (Vth) of the n-channel type TFTs in an appointed range.

In order to form an LDD region of an n-channel type TFT of the drive circuit, an impurity element to give an n-type is selectively doped onto the island-like semiconductor layers 116 and 118. Therefore, resist masks 120a through 120e were formed in advance. Phosphor (P) and arsenic (As) may be used as an impurity element to give the n-type. Herein, the ion doping method using phosphine (PH$_3$) was employed to dope phosphor (P). The formed impurity regions are made into low concentration n-type impurity regions 121 and 122, wherein the concentration of phosphor (P) may range from $2 \times 10^{16}$ through $5 \times 10^{19}$ atoms/cm$^3$. In the specifications, the concentration of an impurity element to give an n-type contained in the impurity regions 121 and 122 formed herein is expressed in terms of (n'). In addition, an impurity region 123 is a semiconductor layer to form a holding capacitance of a pixel matrix circuit, wherein phosphor (P) is doped at the same concentration (See FIG. 8D).

Next, a process, which activates the doped impurity element, is carried out. The activation is carried out by thermal processing at 500 through 600° C. in an atmosphere of nitrogen for one to four hours or a laser activation method. Also, both the thermal processing method and laser activation method may be concurrently carried out at the same time. In the case of the laser activation method, a linear beam is formed by using a KrF excimer laser beam (wavelength: 248 nm), whereby scanning is performed in a state where the overlapping ratio of the linear beam is 80 through 98% when the oscillation frequency is 5 through 50 Hz., and energy density is 100 through 500 mJ/cm$^2$, and the entire surface of a substrate, on which an island-like semiconductor layer is formed, is thereby processed. In addition, there is no factor to be limited for the irradiation conditions of the laser beam, wherein the irradiation conditions may be adequately determined by a practitioner. At this stage, the mask layer 137 is removed by etching it with a solution such as fluorine acid.

Figure 8E:
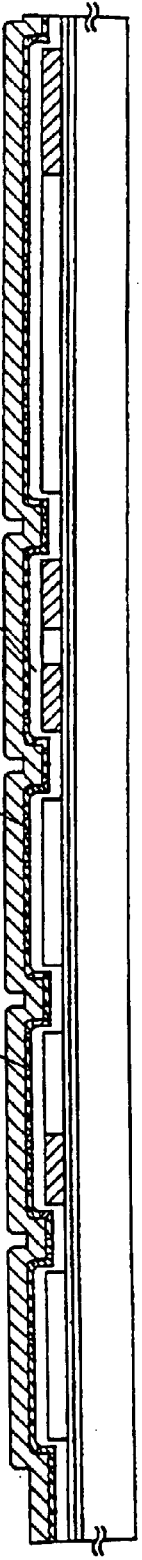

In FIG. 8E, a gate insulation film 127 is formed to be 40 through 150 nm thick by an insulation film containing silicon by using the plasma CVD method or sputtering method. For example, the film 127 may be formed of a silicon oxide nitride film so as to be 120 nm thick. In addition, since the fixed charge density is decreased in the silicon oxide nitride film produced by doping O$_2$ onto SiH$_4$ and N$_2$O, it becomes a preferable material for the application. As a matter of course, the gate insulation film 127 is not limited to such a silicon oxide nitride film, and an insulation film containing other silicon may be used as a singular layer or a laminated structure. In either case, the gate insulation layer 127 is formed so that it acts as a compression force when regarding the substrate as the center.

And, as shown in FIG. 8E, a heat-resisting conductive layer is formed to form a gate electrode on the gate insulation film 127. The heat-resisting conductive layer may be formed of a singular layer. However, it may be formed of a laminated structure consisting of a plurality of layers such as double layers or triple layers as necessary. Using such a heat-resisting conductive layer, for example, the structure may be composed so that a conductive layer (B) 125 consisting of a conductive metal nitride film and a conductive layer (B) 125 consisting of a metal film are laminated. The conductive layer (B) 125 may be formed of an element selected from tantalum (Ta), titanium (Ti), molybdenum (Mo), tungsten (W), or an alloy in which any one of the abovementioned elements is the main constituent, or an alloy film (represented by an Mo—W alloy film or an Mo—Ta alloy film) in which the abovementioned elements are combined, and the conductive layer (A) 124 may be formed of tantalum nitride (TaN), tungsten nitride (WN), titanium nitride (TiN) film, molybdenum nitride (MoN), etc. In addition, tungsten silicide, titanium silicide, or molybdenum silicide may be applied as the conductive layer (A) 124. As regards the conductive layer (B) 125, it is preferable that the concentration of impurities contained therein is reduced in order to attempt to decrease the resistance. In particular, it is better that the oxygen concentration is less than 30 ppm. For example, if the concentration of oxygen was made lower than 30 ppm for tungsten (W), a specific resistance value of 20 $\mu\Omega$cm or less could be achieved.

Th conductive layer (A) 124 may be made 10 through 50 nm thick (preferably, 20 through 30 nm thick) while the conductive layer (B) 125 may be made 200 through 400 nm thick (preferably, 250 through 350 nm thick). Where W is made into a gate electrode, by a sputtering method where the W is used as the target, argon (Ar) gas and nitrogen (N$_2$) gas are introduced, the conductive layer (A) 125 is formed to be 50 nm thick with tungsten nitride (WN), and the conductive layer (B) 124 is formed to be 250 nm thick with W. As other methods, the W film may be formed by a thermal CVD method, using tungsten hexafluoride (WF$_6$). In either case, in order to use it as the gate electrode, it is necessary to make the resistance lower, wherein it is highly recommended that the resistivity of the W film is 20 $\mu\Omega$cm or less. Although it is possible to attempt to lower the resistivity by increasing the grain size of the W film, the resistivity will be increased in a case where impurity elements such as oxygen, etc., reside in the W because the impurity elements hinder crystallization thereof. Therefore, in the case of using the sputtering method, a W target having a purity of 99.9999% is used, and the W film is formed while sufficient attention is being paid so that no impurity is mixed in the gas phase during the forming of the film, whereby the resistivity of 9 through 20 $\mu\Omega$cm can be achieved.

On the other hand, where a TaN film is used for the conductive layer (A) 124, and a Ta film is used for the conductive layer (B) 125, they may be formed by the sputtering method as well. The TaN film may be formed by using a blended gas of argon and nitrogen as the sputtering gas where the Ta is used as a target, and the Ta film may be formed by using an argon gas as the sputtering gas. Further, if a suitable amount of Xe and Kr is added to the sputtering gas, the internal stress of the film to be formed is lightened, whereby the film can be prevented from peeling. The resistivity of the Ta film in a phase is approx. 20 $\mu\Omega$cm, which can be used as the gate electrode. However, the resistivity of the Ta film in β phase is approx. 180 $\mu\Omega$cm, which is not suitable for use as the gate electrode. If the Ta film is formed on the TaN film since the Ta film has a crystalline structure close to the a phase, the Ta film in the a phase could be obtained. Also, although not illustrated, it is effective if a silicon film onto which phosphor (P) is doped at a thickness of 2 through 20 nm is formed below the conductive layer (A) 124, whereby it is possible to improve the contactability of the conductive layer formed thereon and to prevent it from being oxidized, and at the same time, it is possible to prevent alkali metal elements lightly contained in the conductive layer (A) 124 and conductive layer (B) 125 from being diffused onto the gate insulation film 127. In any case, it is preferable that the resistivity of the conductive layer (B) 125 is a range from 10 through 50 $\mu\Omega$cm.

Figure 12D:
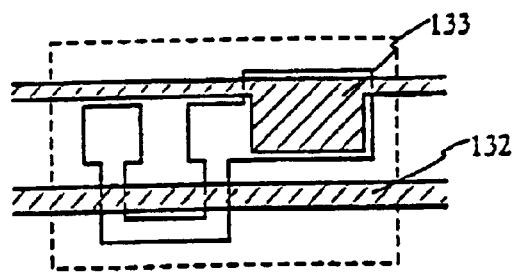

Next, resist masks 126a through 126f are formed by the photo lithography technology, using photo masks, and the conductive layer (A) 124 and conductive layer (B) 125 are collectively etched, whereby gate electrodes 128 through 132 and capacitance wiring 133 are formed. In the gate electrodes 128 through 132 and capacitance wiring 133, 128a through 132a consisting of the conductive layer (A) and 128b through 132b consisting of the conductive layer (B) are integrally formed (See FIG. 9A). In addition, FIG. 11D shows the positional relationship between the island-like semiconductor layers 115, 116 and the gate insulation layers 128, 129 in this state. The relationship among the island-like semiconductor layer 119, gate electrode 132 and capacitance wiring 133 is shown in FIG. 12D. In FIG. 11D and FIG. 12D, the gate insulation film 127 is omitted.

A method for etching the conductive layer (A) and conductive layer (B) may be adequately selected by a practitioner. However, in the case where the conductive layers are formed of a material whose main constituent is W as described above, it is highly recommended that a dry-etching method using high-density plasma is applied in order to carry out etching at a high speed and at high accuracy. As a method to acquire high-density plasma, a microwave plasma etching apparatus or an inductively coupled plasma (ICP) etching apparatus may be used. For example, in the method for etching W using the ICP etching apparatus, two types of gases $CF_4$ and $C_{12}$ are introduced into a reaction chamber as an etching gas, the pressure is set to 0.5 through 1.5 Pa (preferably, 1 Pa), and 200 through 1000 W high frequency (13.56 MHz) power is applied to the inductively coupled portion. At this time, 20 W high frequency power is applied onto the stage on which a substrate is placed, wherein the substrate is charged at the negative potential by self-biasing, thereby accelerating positive ions, and anisotropy etching can be carried out. If an ICP etching apparatus is used, it is possible to obtain an etching speed of 2 through 5 nm per second even on a hard metal film such as W. In addition, in order to carry out etching so that no residue remains, it is better that over-etching is performed with the etching time increased at a rate of 10 through 20%. However, at this time, it is necessary to be careful about the selection ratio of the etching with respect to the underground. For example, since the selection ratio of silicon oxide nitride film (gate insulation film 127) with respect to a W film is 2.5 through 3, the plane to which the silicon oxide nitride film is exposed becomes substantially thin by being etched 20 through 50 nm deep by the over-etching process.

Figure 9A:
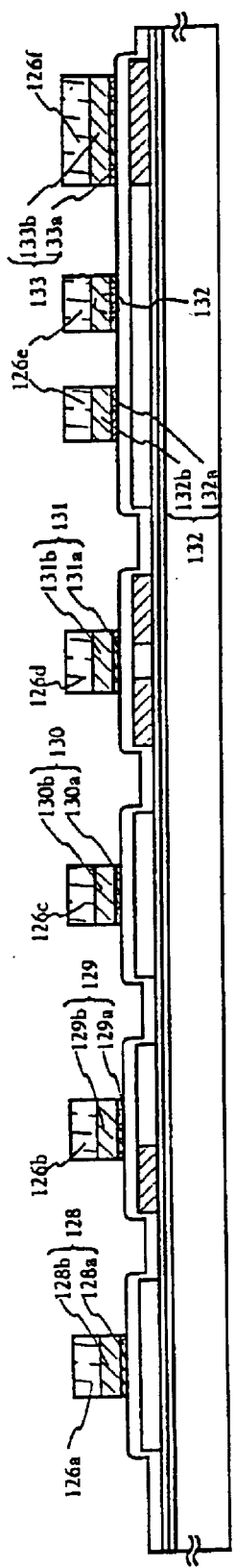
FIGS. 9A–9D are cross-sectional views showing a process to produce a pixel TFT and a drive circuit TFT of Example 1.
Figure 9B:
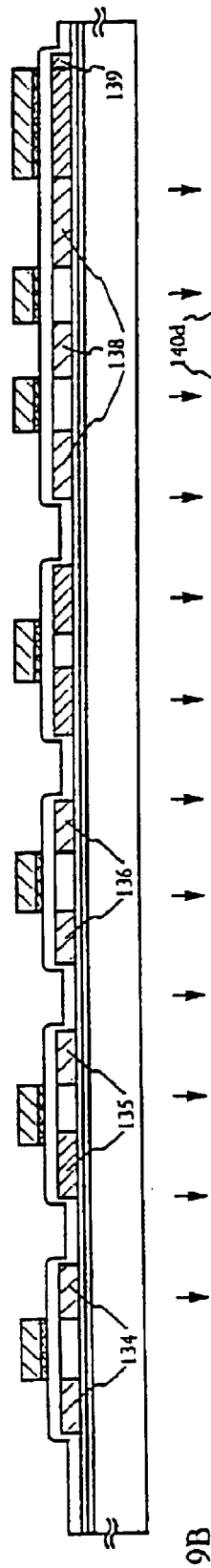
Figure 9C:
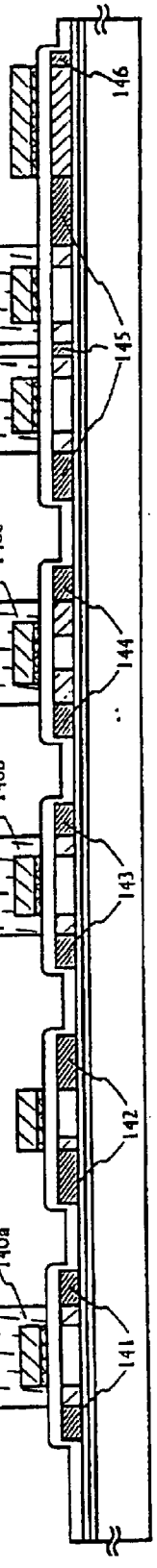

In order to form an LDD region in an n-channel type TFT of a pixel TFT, a process (n" doping process) to dope an impurity element to give an n-type was carried out. Using the gate electrodes 128 through 132 as masks, an impurity element to give the n-type was self-alignment doped by an ion doping method. Phosphor (P) which is doped as an impurity element to give the n-type is doped in a range from $1\times10^{16}$ through $5\times10^{19}$ atoms/cm$^3$ in the concentration. Thus, as shown in FIG. 9B, low concentration n-type impurity regions 134 through 139 are formed in the island-like semiconductor layer.

Next, a high concentration n-type impurity region, which functions as a source region or a drain region, was formed in the n-channel type TFT (n$^+$ doping process). First, using photo masks, resist masks 140a through 140d were formed, and an impurity element to give an n-type was doped to form high concentration n-type impurity regions 141 through 146. Phosphor (P) was used as an impurity element to the n-type, and an ion doping method was carried out, in which phosphine (PH$_3$) was used so that the concentration thereof enters a range from $1\times10^{20}$ through $1\times10^{21}$ atoms/cm$^3$ (See FIG. 9C).

Figure 9D:
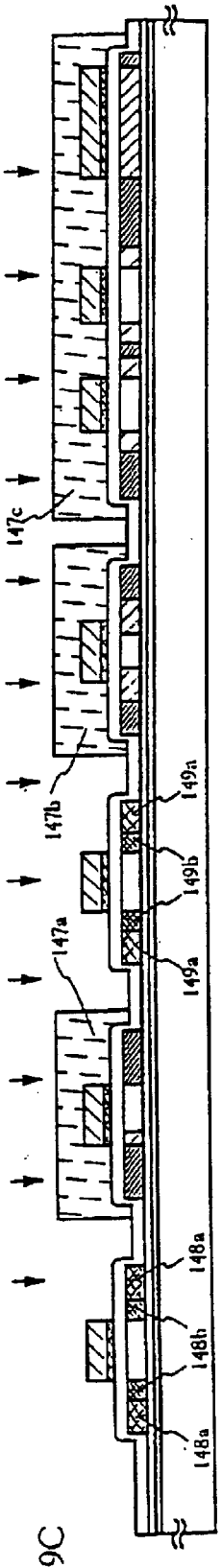

Subsequently, high concentration p-type impurity regions 148 and 149 which become a source region and a drain region were formed in the island-like semiconductor layers 115 and 117 having a p-channel type TFT formed. Herein, using the gate electrodes 128 and 130 as masks, an impurity element to give a p-type was doped to self-alignment form a high concentration p-type impurity region. At this time, resist masks 147a through 147c are formed by using photo masks to shield the entire surface of the island-like semiconductor films 116, 118 and 119 which form an n-channel type TFT. The high concentration p-type impurity regions 148 and 149 are formed by an ion doping method using diborane (B$_2$H$_6$). The concentration of boron (B) in the areas is set to $3\times10^{20}$ through $3\times10^{21}$ atoms/cm$^3$ (FIG. 9D). Since phosphor (P) is doped to the high concentration p-type impurity regions in the previous process, the high concentration p-type impurity regions 148a and 149a contain phosphor (P) at a concentration of $1\times10^{20}$ through $1\times10^{21}$ atoms/cm$^3$ while the high concentration p-type impurity regions 148b and 149b contain phosphor (P) at a concentration of $1\times10^{16}$ through $5\times10^{19}$ atoms/cm$^3$. However, by increasing the concentration of boron (B), which is doped in this process, by 1.5 through 3 times, the high concentration p-type impurity regions does not have a problem in functioning as the source region and drain region in the p-channel type TFT.

Figure 10A:
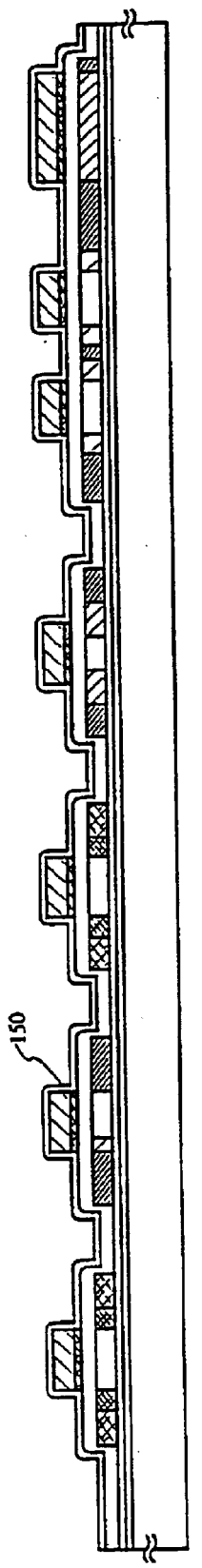
FIGS. 10A–10C are cross-sectional views showing a process to produce a pixel TFT and a drive circuit TFT of Example 1.

Thereafter, as shown in FIG. 10A, a protection insulation film 150 is formed on the gate electrodes and the gate insulation film. The protection insulation film may be formed of a silicon oxide film, silicon oxide nitride film, silicon nitride film, or a laminated film of a combination of these films. In any case, the protection insulation film 150 is formed of an inorganic insulation material. The film thickness of the protection insulation film 150 is set to 100 through 200 nm. Herein, in the case where a silicon oxide film is used, it can be formed by the plasma CVD method in such a manner that tetraethyl orthosilicate: TEOS) and O$_2$ are blended together, the reaction pressure is 40 Pa, and the substrate temperature is 300 through 400° C., wherein high frequency (13.56 MHz) power is discharged at a density of 0.5 through 0.8 W per square centimeter. In the case where a silicon oxide nitride film is used, it may be formed of a silicon oxide nitride film composed of $SiH_4$, $N_2O$, and $NH_3$ or a silicon oxide nitride film composed of $SiH_4$ and $N_2O$ by the plasma CVD method. The production conditions in this case are such that the reaction stress is 20 through 200 Pa, the substrate temperature is 300 through 400° C., and the high frequency (60 MHz) power density is 0.1 through 1.0 W/cm². In addition, a silicon oxide nitride hydroride film composed of $SiH_4$, $N_2O$ and $H_2$ may be applied thereto. The silicon nitride film may be also made of $SiH_4$ and $Nh_3$ by the plasma CVD method. Such a protection insulation film is formed so that a compression strain operates with respect to the substrate.

After that, a process for activating impurity elements to give an n-type or p-type doped at the respective concentrations is carried out. The process is performed by a thermal annealing method in an annealing furnace is used. In addition thereto, the laser annealing method or rapid thermal annealing method (RTA method) may be employed instead. In the thermal annealing method, impurity elements are activated at a temperature 400 through 700° C., representatively 500 through 600° C. in a nitrogen atmosphere whose oxygen content is less than 1 ppm, and preferably, less than 0.1 ppm. In the example, the activation was performed at 550° C. for four hours. Also, where a plastic substrate whose heat resisting temperature is low is used as the substrate 101, it is preferable that the laser annealing method is carried out (See FIG. 10B).

After the activation process, a thermal process is carried out at a temperature of 300 through 450° C. in an atmosphere containing hydrogen at a ratio of 3 through 100% for one through twelve hours, whereby the island-like semiconductors are hydrogenated. The hydrogenating process is to terminate dangling bonds of $10^{16}$ through $10^{18}$/cm³, which exist in the island-like semiconductor layers, with thermally pumped hydrogen. As another means of hydrogenating, plasma hydrogenating may be carried out (that is, hydrogen pumped by plasma is used). Also, by thermal processing at 300 through 450° C., hydrogen of the silicon oxide nitride hydroride film 102b of the underground film 102 and of the silicon oxide nitride film of the protection insulation film 150 may be diffused to hydrogenate the island-like semiconductor layer.

After the activation and hydrogenating processes are finished, an interlayer insulation film 151 consisting of an organic insulation material is formed so as to have a mean thickness of 1.0 through 2.0 μcm. Polyimide resin, acrylic resin, polyamide resin, polyimideamide resin, BCB (benzocyclobutene) resin, etc., may be used as an organic resin material. For example, in a case where polyimide resin of such a type, that is thermally polymerized after being coated on a substrate, is used, the interlayer insulation film may be formed by baking it at a temperature of 300° C. using a clean oven. Also, in a case where acrylic resin is used, a two-liquid type may be used, which is coated on the entire substrate by using a spinner after the main agent and hardening agent are blended, and is preheated at 80° C. for 60 seconds, using a hot plate. Furthermore, the interlayer insulation film may be formed at a temperature of 250° C. for 60 minutes, using a clean oven.

By forming an interlayer insulation film of an organic insulation material, the surface thereof can be flattened well. Also, since the dielectric constant of organic resin materials is usually low, the parasitic capacitance can be decreased.

However, the organic insulation materials are not suitable as a protection film because of its humidity absorbing property. As in the embodiment, it is necessary to use the organic insulation materials in combination with a silicon oxide film, silicon oxide nitride film and silicon nitride film, which are formed as the protection insulation film 150.

Thereafter, using photo masks, resist masks of an appointed pattern are formed, and subsequently contact holes which reach the source region or drain region formed on respective island-like semiconductor films are formed. The contact holes are formed by a dry etching method. In this case, a blended gas of $CF_4$, $O_2$ and He is used as an etching gas, wherein the interlayer insulation film made of an organic resin material is first etched. After that, continuously, the etching gas is changed to $CF_4$ and $O_2$, thereby etching the protection insulation film 146. In addition, in order to increase the selection ratio with respect to the island-like semiconductor layers, the etching gas is changed to $CHF_4$ to etch the gate insulation film, whereby the contact holes can be formed well.

Next, a conductive metallic film is formed by the sputtering method or vacuum metallizing method, and resist mask patterns are formed of photo masks. Further, source wirings 152 through 156 and drain wirings 157 through 161 are formed by etching. A drain wiring 162 indicates a drain wiring of a pixel adjacent thereto. Herein, the drain wiring 161 functions as a pixel electrode. Although not illustrated, in the embodiment, the wiring of the electrode is formed so that a Ti film was formed to be 50 through 150 nm thick, and the electrode is brought into contact with the semiconductor film on which the source or drain region of the island-like semiconductor layer is formed, and aluminum (Al) is formed to be 300 through 400 nm thick so as to overlap the Ti film.

Figure 11E:
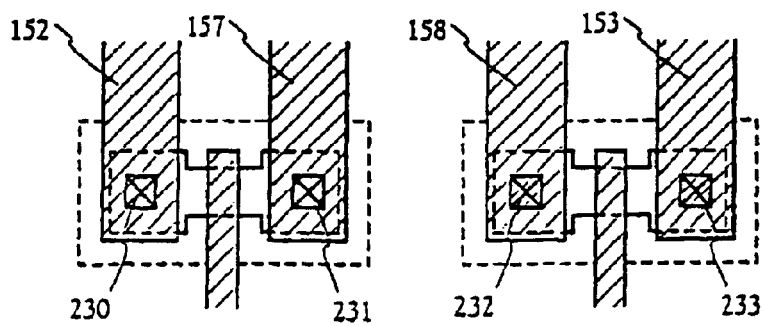
Figure 12E:
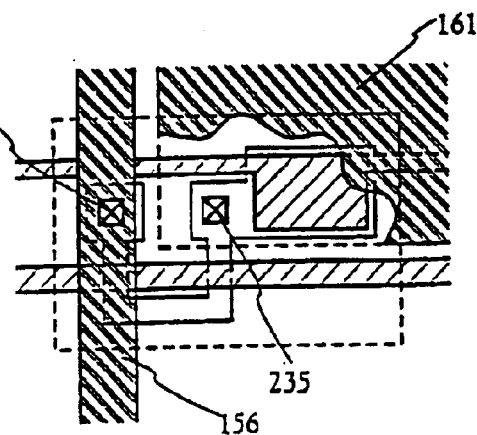

FIG. 11E is an upper plan view showing the island-like semiconductor layers 115, 116, gate electrodes 128, 129, source wirings 152, 153, and drain wirings 157, 158 in this state. The source wirings 152 and 153 are, respectively, connected to the island-like semiconductor layers 115 and 116 by contacts holes provided at the interlayer insulation film and protection insulation film (both of which are not illustrated) at 230 and 233. Also, the drain wirings 157 and 158 are connected to the island-like semiconductor layers 115 and 116 at 231 and 232. As well, FIG. 12E is an upper plan view showing the island-like semiconductor layer 119, gate electrode 132, capacitance wiring 133, source wiring 156 and drain wiring 161, wherein the source wiring 156 is connected to the island like semiconductor layer 119 at the contact portion 234 and the drain wiring 161 is connected to the same at the contact portion 235. In any case, an area, at which strains remain in the internal area of the island-like semiconductor layer having the first shape, is removed, thereby causing an island-like semiconductor layer having the second shape to be formed, and a TFT is formed.

If a hydrogenating process is carried out in this state, a favorable result could be obtained with a view to improving the characteristics of the TFT. For example, it is better that a thermal process is carried out in an atmosphere containing hydrogen at a ratio of 3 through 100% at a temperature of 300 through 450° C. for one through twelve hours, or a similar result could be obtained by using the plasma hydrogenating method. In addition, by this type of hydrogenating method, hydrogen existing in the protection insulation film 146 and underground layer 102 can be diffused in the island-like semiconductor films 115 through 119. In any case, it is highly recommended that the defect density of the island-like semiconductor films 115 through 119 is decreased to $10^{16}/cm^3$ or less. Therefore, it was sufficient that hydrogen was given at a ratio of $5\times10^{18}$ through $5\times10^{19}$ atoms/$cm^3$ (See FIG. 10C). As regards the island-like semiconductor layer to which such processes are applied, a barely existing grain boundary is made inactive, whereby an area which can be substantially regarded as a single crystal was formed.

Thus, it is possible to complete a substrate having drive circuit TFTs and pixel TFTs on the same substrate. The first p-channel type TFT 200, first n-channel type TFT 201, second p-channel type TFT 202, and second n-channel type TFT 203 are formed in the drive circuit, and a pixel TFT 204 and a holding capacitance 204 are formed in the pixel portion. In the specification, this type of a substrate is called an "active matrix substrate" for convenience.

The first p-channel type TFT 200 of the drive circuit has a single drain structure having a channel forming region 206, source regions 207a and 207b consisting of a high concentration p-type impurity region, drain regions 208a and 208b in the island-like semiconductor film 115. The first n-channel type TFT 201 has a channel forming region 209, an LDD region 210 overlapping the gate electrode 119, source region 212, and drain region 211 in the island-like semiconductor film 116. In the LDD region, the LDD region overlapping the gate electrode 119 was made into Lov, and the length in the lengthwise direction of the channel was set to 0.5 through 3.0 μm, preferably, 1.0 through 2.0 μm. By setting the length of the LDD region in the n-channel type TFT to such a length, a high potential occurring in the vicinity of the drain region is lightened to prevent hot carriers from being generated and to prevent the TFTs from deteriorating. As well, the second p-channel type TFT 202 of the drive circuit has a single drain structure having a channel forming region 213, source regions 214a and 214b consisting of a high concentration p-type impurity region, and drain regions 215a and 215b in the island-like semiconductor film 117. The second n-channel type TFT 203 has a channel forming region 216, LDD regions 217 and 218 partially overlapping the gate electrode 121, source region 220, and drain region 219 in the island-like semiconductor film 118. The length of the LDD region Lov overlapping the gate electrode of the TFT is set to 0.5 through 3.0 μm, and preferably, 1.0 through 2.0 μm. And, the LDD region not overlapping the gate electrode was made into Loff, wherein the length in the lengthwise direction of the channel was set to 0.5 through 4.0 μm, and preferably, 1.0 through 2.0 μm. The pixel TFT has channel forming regions 221, 222, LDD regions 223 through 225, source or drain regions 226 through 228 in the island-semiconductor film 119. The length in the lengthwise direction of the channel in the LDD region (Loff) is 0.5 through 4.0 μm, and preferably, 1.5 through 2.5 μm. In addition, the holding capacitance 205 is formed of a capacitance wiring 123, an insulation film composed of the same material as that of the gate insulation film, and a semiconductor layer 229 connected to the drain region 228 of the pixel TFT 204. In FIG. 10C, although the pixel TFT 204 was composed by a double-gate structure, there is no problem if it is composed of a single gate structure of a multi-gate structure in which a plurality of gate electrodes are provided.

Figure 13:
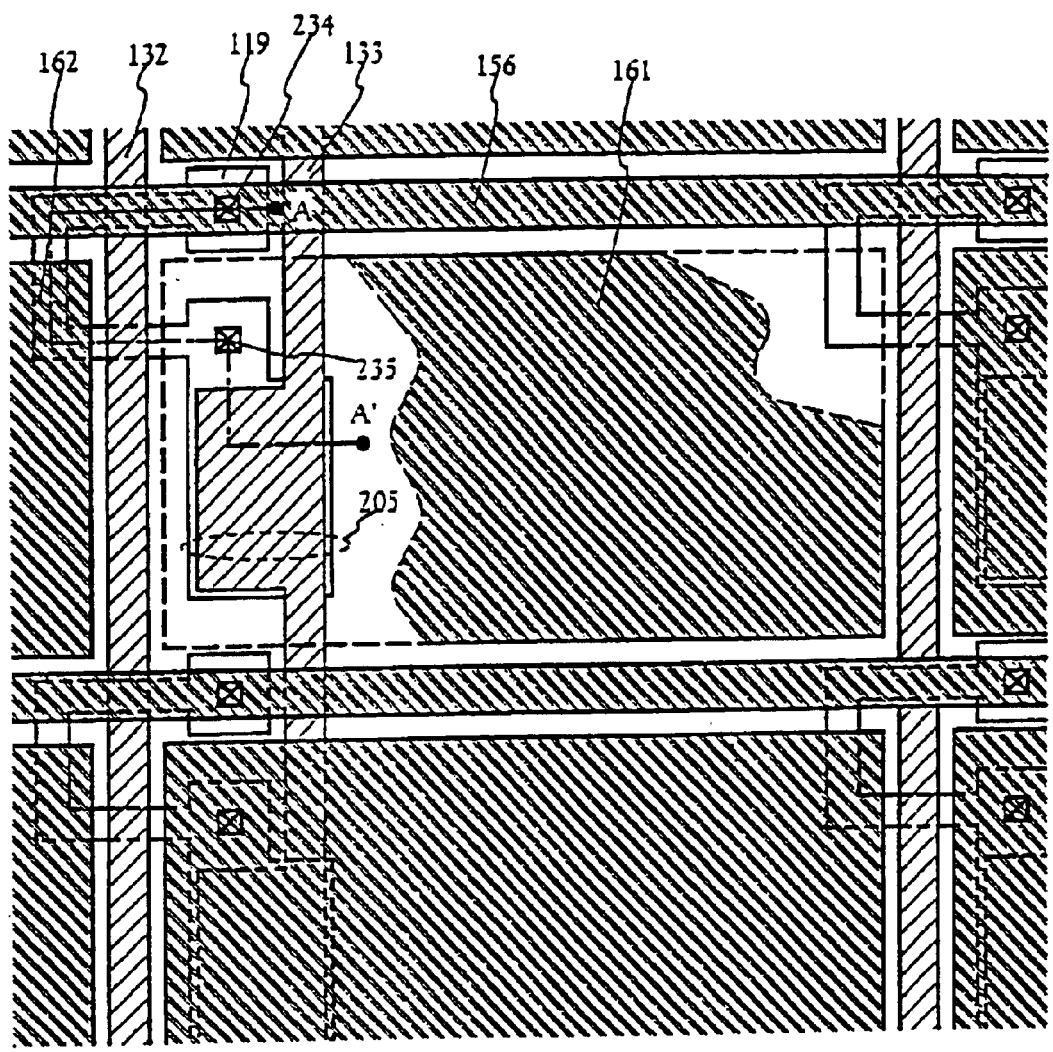
FIG. 13 is an upper plan view showing pixels in a pixel portion of Example 1.

FIG. 13 is an upper plan view showing almost all of one pixel of the pixel portion. A cross-sectional view taken along the line A–A' in the drawing corresponds to the sectional view of the pixel portion illustrated in FIG. 10C. In the pixel TFT 204, the gate electrode 132 concurrently functioning as a gate wiring crosses the island-like semiconductor layer 119 thereunder via a gate insulation film (not illustrated).

Although not illustrated, a source region, drain region and LDD region are formed in the island-like semiconductor layer. Also, 234 indicates a contact portion at which the source wiring 156 and source region 226 are brought into contact with each other. 235 is a contact portion at which the drain wiring 161 and drain region 228 are brought into contact with each other. The holding capacitance 205 is formed of a semiconductor layer 229 extending from the drain region of the pixel TFT 204 and an area where the capacitance wiring overlaps via the gate insulation film.

An island-like semiconductor layer formed via the above-mentioned processes by the dual beam laser annealing method according to the invention has a single crystal structure. By optimizing the TFT structure constituting the respective circuits in response to the specifications requested in connection with the pixel TFT and drive circuit, using such an island-like semiconductor layer, it becomes possible to improve the performance and reliability of a semiconductor device. In addition, by forming the gate electrodes of conductive materials having a heat-resistant property, activation of the LDD region, source region and drain region can be facilitated. And, with such an active matrix substrate, it is possible to achieve a high quality display device. Based on the active matrix substrate produced in compliance with the preferred embodiment, it is possible to produce a reflection type liquid crystal display device.

EXAMPLE 2

In the invention, in view of applying the dual beam laser annealing method, the size of an island-like semiconductor layer to be annealed preferably is devised to have an area of 50 μm or less in terms of the distance from the center to the end portion. However, a request that the channel width of the TFT is 50 μm or more in view of the circuit characteristics may be possible. Example 2 shows an example of an island-like semiconductor layer that can sufficiently obtain the effects of the invention in such a case.

Figure 14A:
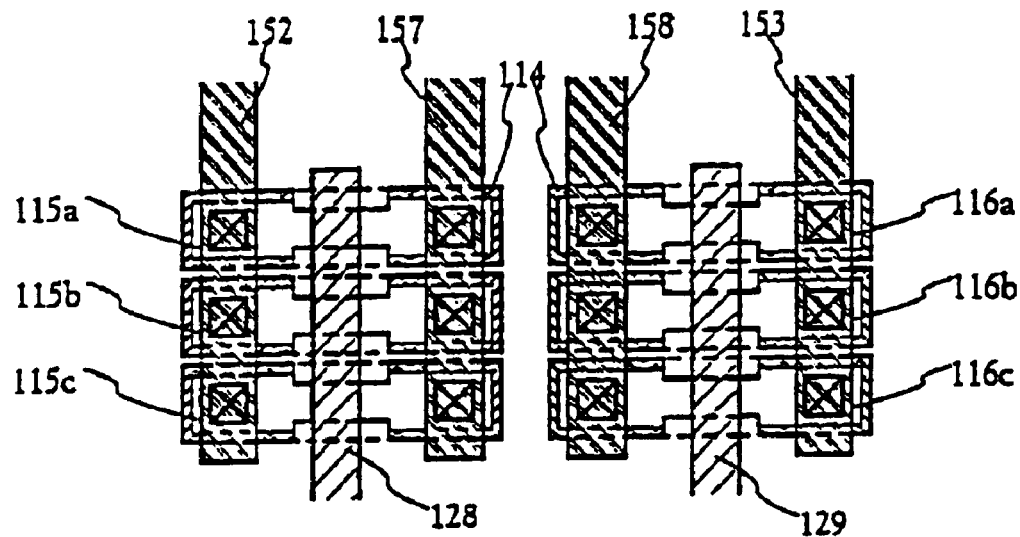
FIGS. 14A–14B are upper plan views explaining the structure of a TFT of Example 2.

FIG. 14 is an upper plan view, corresponding to FIG. 10C, in the TFT of the drive circuit of an active matrix substrate described with reference to FIG. 8A through FIG. 10C. Island-like semiconductor layers 115a through 115c and 116a through 116c having the second shape, which are divided into a plurality, are, respectively, formed so as to have an interval there among. By the island-like semiconductor layers having the second shape being formed with an interval as in the island-like semiconductor layers having the first shape, a direct laser beam and a diffused laser beam can be effectively utilized in the process of crystallizing by the dual beam laser annealing method. That is, either of island-like semiconductor layers 115a, 115c, 116a and 116c located outside or island-like semiconductor layers 115b and 116b located at the middle part can be formed so as to have a crystalline semiconductor layer having a crystalline property equivalent to each other. FIG. 14A shows a state where gate electrodes 128, 129, source wirings 152, 153 and drain wirings 157, 158 are formed on such an island-like semiconductor layer. And, the areas 114 where stresses have accumulated may remain as they are, excepting the channel forming region in which the gate electrode overlaps the island-like semiconductor layer, and its surrounding areas. Thus, even though a TFT is produced in a state where the area 114 in which stresses have accumulated remains as it is, at portions at least excepting the channel forming region, it does not constitute any cause of deterioration of the characteristics as in the above. Such a structure may be applicable to the TFTs produced in the example 1. As a matter of course, there is no limitation in the number of dividing the island-like semiconductor layers, and it is possible that the number of p-channel type TFTs differs from that of the n-channel type TFTs. With such TFTs, it is possible to form various circuits including an inverter circuit that is the basic circuit of a CMOS circuit.

Figure 14B:
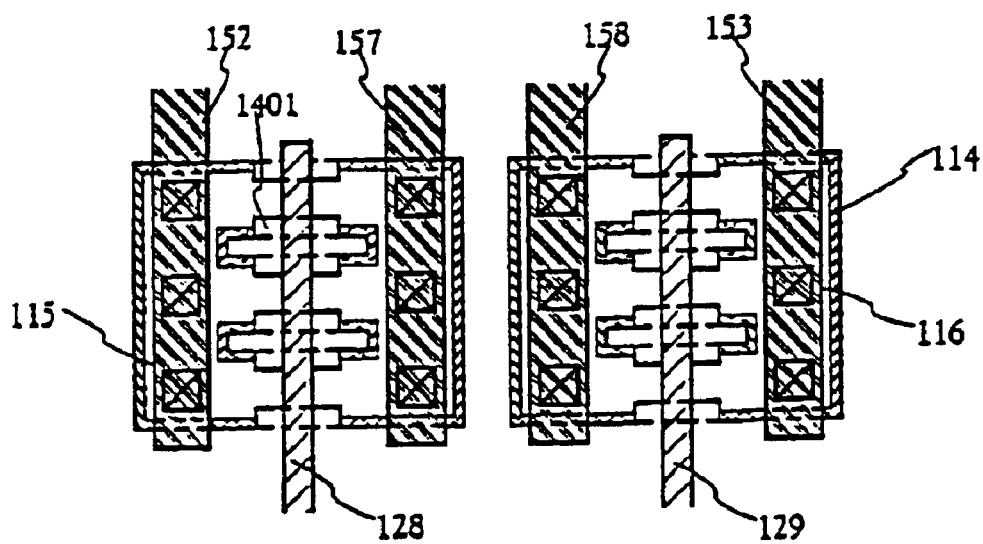

In addition, FIG. 14B is an example in which at least an opening 1401 is provided inside the respective island-like semiconductor layers 115 and 116 having the second shape. By such an opening 1401 being provided in advance in the island-like semiconductor layer having the first shape and crystallization being carried out by the dual beam laser annealing method, a direct laser beam and a diffused laser beam can be effectively utilized as well. FIG. 14B shows a state where gate electrodes 128, 129, source wirings 152, 153 and drain wirings 157, 158 are formed on such an island-like semiconductor layer, wherein an area 114 in which stresses have accumulated may be left as it is, at portions other than the channel forming region where the gate electrodes and island-like semiconductor layer overlap each other, and its surrounding areas.

EXAMPLE 3

In the example 1, all or a part of the LDD regions of the first n-channel type TFT 201 and the second n-channel type TFT 203 of the drive circuit were formed of a so-called GOLD (Gate-drain Overlapped LDD) structure in which they are formed so as to overlap each other. However, in order to simplify the processes and to produce semiconductor device at lower costs, there is another method in which the GOLD structure is omitted, and the n-channel type TFTs are produced by the LDD structure. In the GOLD structure, although it is possible to prevent the hot carriers from deteriorating in the n-channel type TFTs, it is possible to suppress deterioration of the hot carriers by adequately setting the length of the LDD region in the lengthwise direction of the channel.

Figure 15:
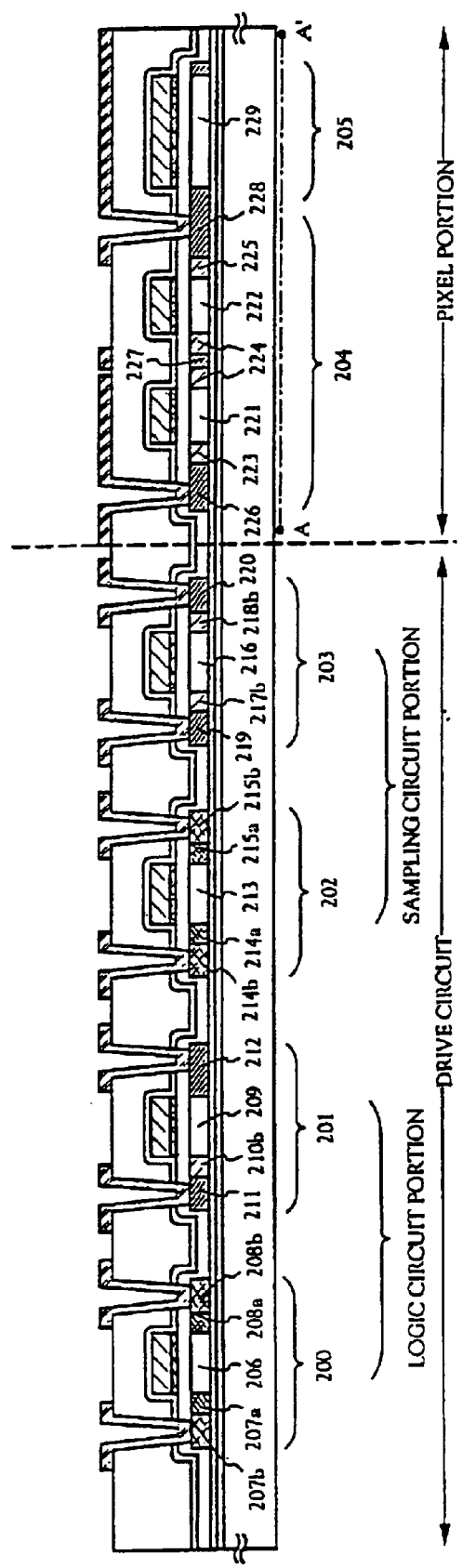
FIG. 15 is a cross-sectional view showing a construction of a pixel TFT and a drive circuit TFT of Example 3.

In order to produce the first n-channel type TFT 201 and the second n-channel type TFT 203 of the drive circuit as a TFT of the LDD structure, in the processes described with reference to FIG. 8(D) through FIG. 10 in the example 1, the process described with reference to FIG. 8 may be omitted. FIG. 15 shows an active matrix substrate which is produced by such processes.

In FIG. 15, the first p-channel type TFT 200 of the drive circuit has a single drain structure having a channel forming region 206, source regions 207a and 207b consisting of a high concentration p-type impurity region, and drain regions 208a and 208b in the island-like semiconductor film 115. The first n-channel type TFT 201 has a channel forming region 209, an LDD region 210b not overlapping the gate electrode 129, a source region 212, and a drain region 211 in the island-like semiconductor film 116. The length of the channel in its lengthwise direction in the LDD region was set to 1.0 through 4.0 μm, and preferably, 2.0 through 3.0 μm. By setting the length of the LDD region in the n-channel type TFT to such a value, high potential occurring in the vicinity of the drain region can be lightened to prevent hot carriers from occurring, thereby preventing the TFTs from deteriorating. Similarly, the second p-channel type TFT 202 of the drive circuit has a single drain structure having a channel forming region 213, source regions 214a and 214b consisting of a high concentration p-type impurity region, and drain regions 215a and 215b in the island-like semiconductor film 117. The second n-channel type TFT 203 has a channel forming region 216, LDD regions 217b, 218b, source region 220, and drain region 219 formed in the island-like semiconductor film 218. The length of the LDD of the TFT was formed to be 1.0 through 4.0 μm. The pixel TFT 204 has channel forming regions 221, 222, LDD regions 223 through 225, source or drain regions 226 through 228 formed in the island-like semiconductor film 119. The length of the channel in its lengthwise direction in the LDD region is 0.5 through 4.0 μm, and preferably, 1.5 through 2.5 μm. In addition, the holding capacitance 205 is formed of a capacitance wiring 133, an insulation material composed of the same material as that of the gate insulation film, and a semiconductor layer 229 connected to the drain region 228 of the pixel TFT 204.

Also, in the processes of the example, a TFT configuration described in the example 2 may be employed. And, it is possible to produce a reflection type liquid crystal display device from the active matrix substrate produced by the example.

EXAMPLE 4

An active matrix substrate produced by the example 1 may be applicable to a reflection type liquid crystal display device as it is. On the other hand, where a transmission type liquid crystal display device is produced, pixel electrodes provided at respective pixels in the pixel portion may be formed of transparent electrodes. In the example, a description is given of an active matrix substrate corresponding to a transmission type liquid crystal display device with reference to FIGS. 16A–16B in this example.

Figure 16:
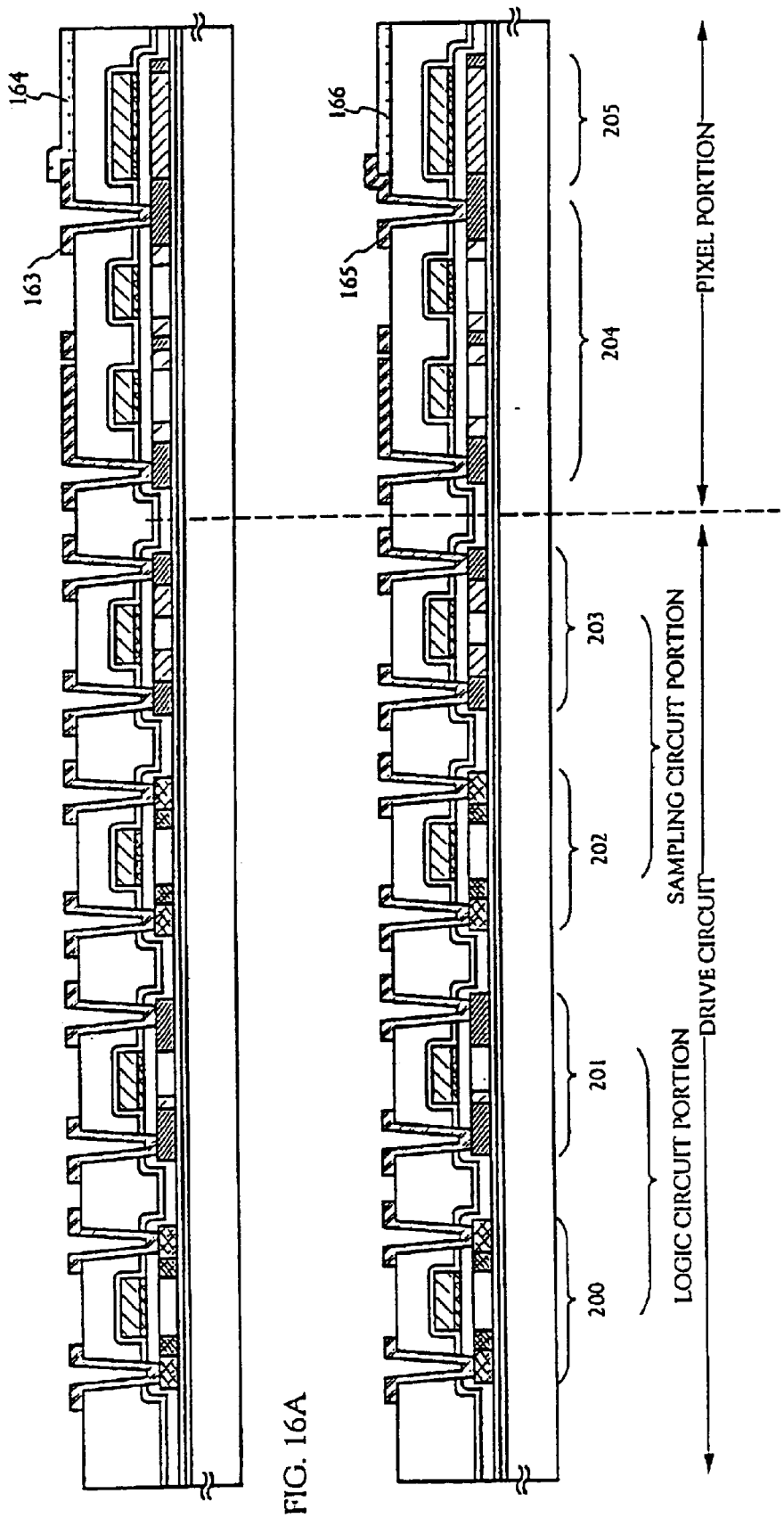
FIGS. 16A–16B are cross-sectional views showing a construction of a pixel TFT and a drive circuit TFT of Example 4.

The active matrix substrate is produced as in the example 1. In FIG. 16A, the source wirings and drain wiring are formed by a conductive metallic film, using the sputtering method or vacuum metallizing method. This is such that a 3-layered structure is employed, in which a Ti film is formed to be 50 through 150 nm thick, contacts are provided with respect to a semiconductor film which forms the source region or drain region of an island-like semiconductor layer, aluminum (Al) is formed to be 300 through 400 nm thick so as to overlap the Ti film, and another Ti film or titanium nitride (TiN) film is formed to be 100 through 200 nm thick. After that, a transparent conductive film is formed on the entire surface, whereby a pixel electrode 171 is formed by a patterning process or etching process using photo masks. A pixel electrode 164 is formed on the interlayer insulation film 151, and a portion which overlaps the drain wiring 163 of the pixel TFT 204 is provided, thereby constituting a connection structure.

FIG. 16B shows an example, in which a transparent conductive film is first formed on the interlayer insulation film 151, and after a pixel electrode 166 is formed by carrying out a patterning process and an etching process, a drain wiring 165 is formed by providing a portion overlapping the pixel electrode 166. The drain wiring 165 is such that a Ti film is formed to be 50 through 150 nm thick, contacts are provided with respect to a semiconductor film which forms the source region or drain region of an island-like semiconductor layer, and aluminum (Al) is formed to be 300 through 400 nm thick so as to overlap the Ti film. With this construction, the pixel electrode 166 is brought into contact with only the T film which forms the drain wiring 165. As a result, in comparison with the construction shown in FIG. 16A, it is possible to securely prevent the transparent conductive material from reacting with Al.

The transparent conductive film may be formed of a material formed of indium oxide ($In_2O_3$), and an alloy of indium oxide and tin oxide ($In_2O_3$—$SnO_2$;ITO) by the sputtering method or vacuum metallizing method. Etching of such materials is carried out by a hydrochloric solution. However, since residues are liable to be generated in etching of the ITO, an alloy of indium oxide and zinc oxide ($In_2O_3$—ZnO) may be used in order to improve the etching property. The indium oxide and zinc oxide alloy is excellent in surface smoothness and thermal stability with respect to the ITO, whereby it is possible to prevent a corrosion reaction with aluminum (Al) with which the alloy is brought into contact at the end face of the drain wiring 163 in the structure in FIG. 16A. Similarly, zinc oxide (ZnO) is also a suitable material, and zinc oxide to which Gallium (Ga) is doped (ZnO:Ga) may be used in order to improve the transmission ratio and conductivity of a visible light.

Thus, an active matrix substrate corresponding to a transmission type liquid crystal display device can be completed. In the embodiment, the description was given where it is assumed that the processes thereof are based on those in the example 1. However, such a construction may be applicable to an active matrix substrate shown in the examples 2 and 3.

EXAMPLE 5

In a method for producing island-like semiconductor layer having a crystalline structure by the dual beam laser annealing method according to the present invention from island-like semiconductors having an amorphous structure, a slight amount ($1 \times 10^{17}$ through $1 \times 10^{19}$ atoms/cm$^3$) of a catalytic element remains in an island-like semiconductor layer in the corresponding island-like semiconductor layer having a crystallized structure by the methods according to the example 2 or 3. As a matter of course, although it is possible to complete a TFT under such conditions, it was more preferable that the remaining catalytic element is removed from at least the channel forming regions. There is a means in which a gettering action by phosphor (P) is utilized, as one of the means for removing the catalytic element.

Figure 10B:
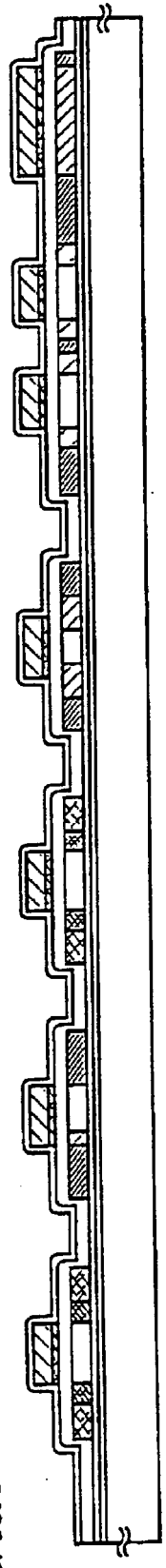
Figure 10C:
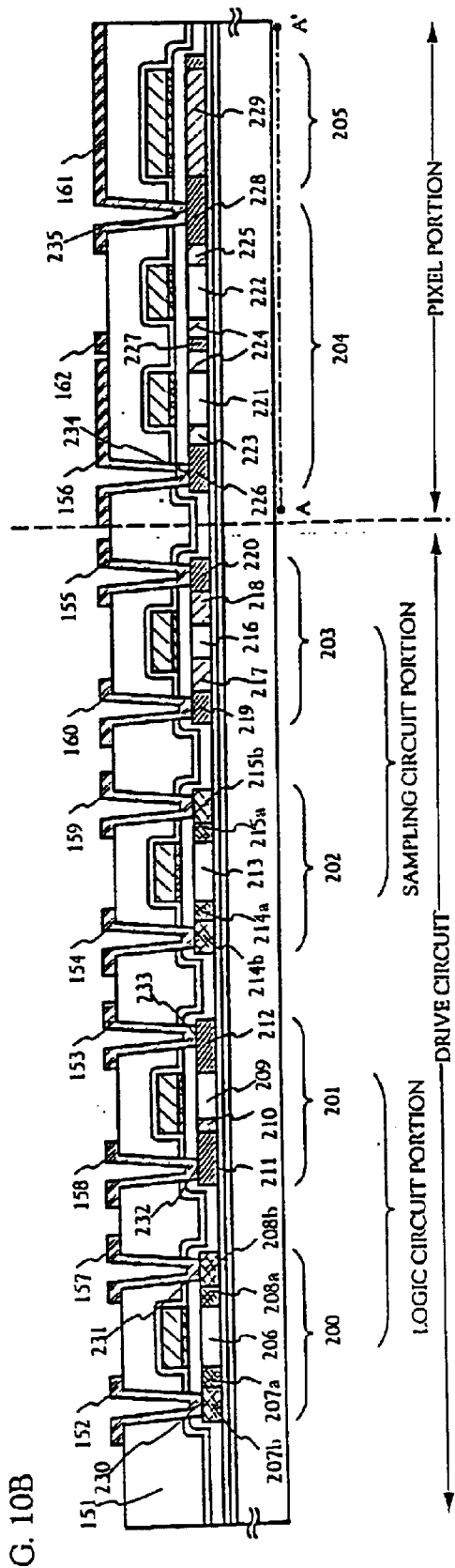
Figure 17:
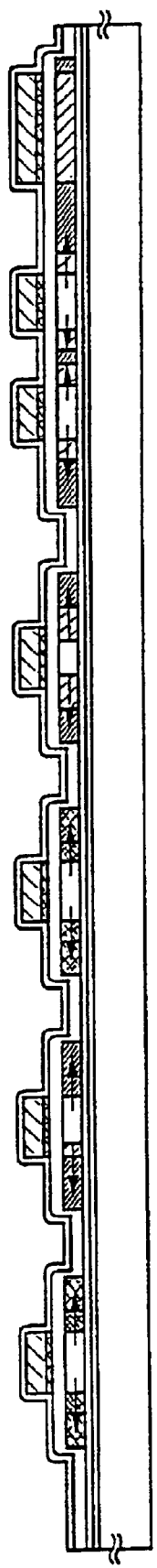
FIG. 17 is a cross-sectional view showing a process to produce a pixel TFT and a drive circuit TFT of Example 5.

The gettering process using phosphor (P) for the purpose can be simultaneously carried out in the activation process described in FIG. 10B. A description is given of the state with reference to FIG. 17. The concentration of phosphor (P) necessary for the gettering is to the same degree as that of the impurity concentration in a high concentration n-type impurity region, and by thermal annealing in the activation process, the catalytic element can be segregated from the channel forming regions of an n-channel type TFT and a p-channel type TFT to an impurity region containing phosphor (P) at the concentration (in the direction shown by the arrow in FIG. 17). As a result, the catalytic element was segregated in the impurity region, and the concentration became $1 \times 10^{17}$ through $1 \times 10^{19}$ atoms per cubic centimeter. In the TFTs thus constructed, the OFF current value is decreased, and their crystallization was improved, whereby a high field effect mobility can be obtained, thereby accomplishing better characteristics.

EXAMPLE 6

Figure 18A:
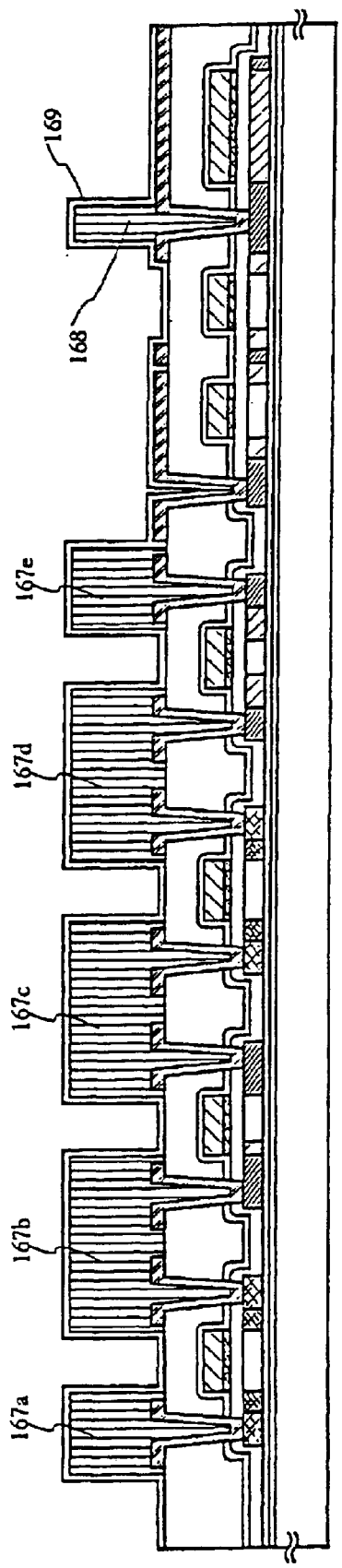
FIGS. 18A–18B are cross-sectional views showing a process to produce an active matrix type liquid crystal display device of Example 6.

In the example, a description is given of a process of producing an active matrix type liquid crystal display device from the active matrix substrate produced in the example 1. First, as shown in FIG. 18A, a spacer consisting of a columnar spacer 168 is formed on the active matrix substrate in the state shown in FIG. 10C. The spacer may be provided by the method for spraying grains of several microns. However, herein, the method is employed, which forms a spacer by patterning a resin film formed on the entire surface of a substrate. Although there is no limitation on the materials of the spacer, for example, NN700 made by JSR Corporation is used, wherein after the NN700 is coated by a spinner, an appointed pattern is produced by exposure and developing. Further, the NN700 is heated at 150 through 200° C. in a clean oven, etc., and is hardened. In the spacer thus constructed, it is possible to make the profile or shape different based on the conditions of exposure and developing. However, preferably, if the spacer 168 is made columnar and its top part is made flat, a sufficient mechanical strength can be secured as a liquid crystal display panel when a substrate at the opposite side is applied thereto. There is no special limitation in the shape, which may be conical or pyramidal. Where it is, for example, conical, the height H thereof may be 1.2 through 5 μm, the mean radius L1 may be 5 through 7 μm, and the ratio of the mean radius L1 and the radius L2 at the bottom portion L2 may be 1 to 1.5. At this time, the tapering angle at the side may be ±15° or less.

The columnar spacer may be positioned at any place. However, preferably, as shown in FIG. 18A, the columnar spacer 168 may be formed so as to cover up the pixel portion, overlapping the contact portion 235 of the drain wiring 161 (pixel electrode). The contact portion 235 loses its flatness and the liquid crystal is not well orientated, and the columnar spacer 168 is thus formed in a manner that fills a spacer resin in the contact portion 235, whereby it is possible to prevent disclination, etc.

Thereafter, an orientation film 169 is formed. Polyimide resin is usually used for the orientation film of a liquid crystal display element. After the orientation film is formed, orientation was carried out so that liquid crystal particles have a certain pretilt angle by applying a lapping process, wherein an area on which the lapping is not performed was determined to be 2 μm or less in the lapping direction from the end portion of the columnar spacer 168 provided in the pixel portion. If spacers 167a through 167e are formed on at least the source wiring and drain wiring on the TFTs of the drive circuit although generation of static electricity frequently constitutes a problem in the lapping process, it becomes possible to obtain the original roles as the spacers in the lapping process and the effect of protecting the TFTs from static electricity.

A light shielding film 171, a transparent conductive film 172 and an orientation film 173 are formed on the opposed substrate 170 opposite thereto. The light shielding film 171 is such that Ti, VCr, Al, etc., is formed to be 150 through 300 nm thick. And, an active matrix substrate in which the pixel portion and rive circuit are formed, and substrate opposite thereto are adhered to each other by using a sealing agent 174. The sealing agent 174 is blended with a filler 175, wherein the two substrates are adhered to each other at an uniform interval by the filler 175 and spacers 167 and 168. Thereafter, a liquid crystal material 176 is supplied between both the substrates and is completely sealed with a sealing agent (not illustrated). Publicly known liquid crystal may be used as the liquid crystal material. For example, an antiferroelectric blended liquid crystal having no threshold value, which shows an electro-optical response property in which the transmissivity continuously changes with respect to an electric field, may be used in addition to TN liquid crystal. There is one which shows a V-shaped type electro-optical response property in the antiferroelectric blended liquid crystal having no threshold value. Thus, an active matrix type liquid display device shown in FIG. 18B is completed.

Figure 18B:
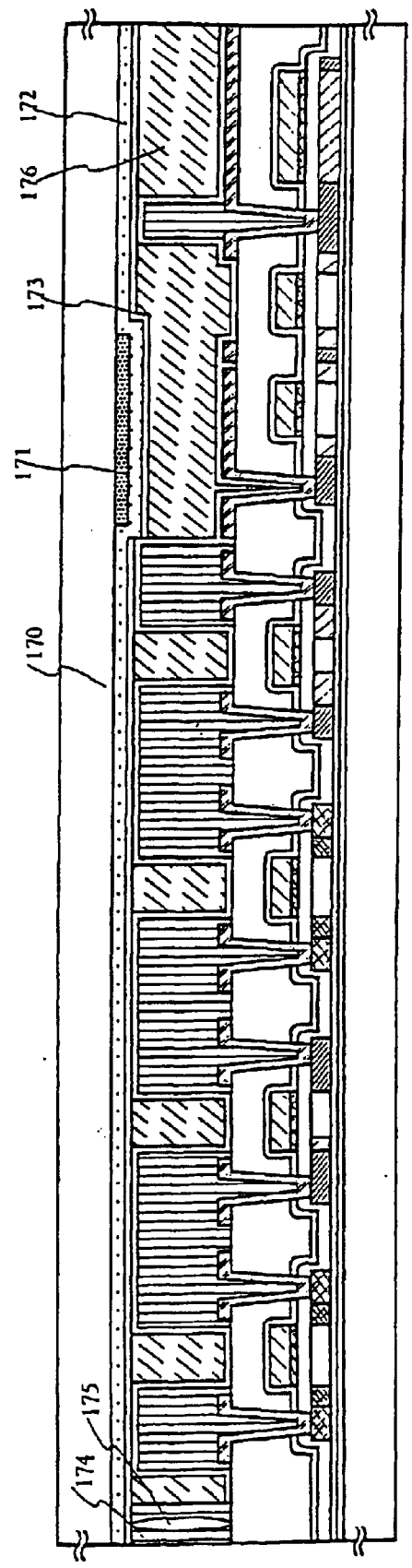

In FIGS. 18A–18B, the spacer 167 is divided into several parts, and divided spacers 167a through 167e are provided on at least the source wiring and drain wiring on the TFTs of the drive circuit. However, there is no problem if the spacer is formed so as to cover up the entire surface of the drive circuit.

Figure 19:
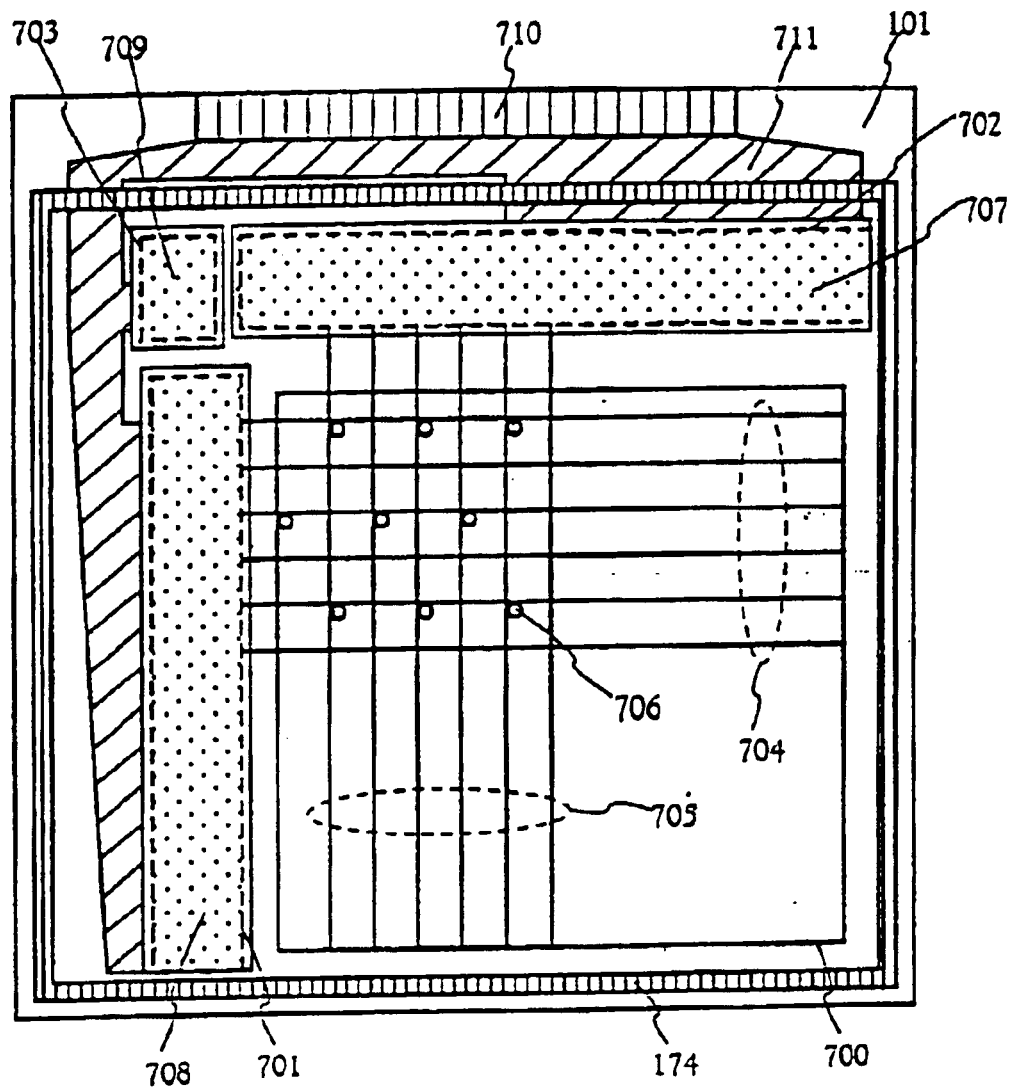
FIG. 19 is an upper plan view explaining an arrangement of an input and output terminal, wiring, circuit arrays, spacers, and a sealing agent in the liquid crystal display device of Example 6.

FIG. 19 is an upper plan view of the active matrix substrate, which is a plan view showing the positional relationship between the pixel portion and the drive circuit, and the spacer and the sealing agent. A scanning signal drive circuit 701 and an image signal drive circuit 702 are provided as the drive circuits in the surrounding of the pixel portion 700. In addition, other signal processing circuits 703 such as CPU, memories, etc., may be provided. And, these drive circuits are connected to a peripheral input and output terminal 710 by a connection wiring 711. In the pixel portion 700, a gate wiring group 704 extending from the scanning signal drive circuit 701 crosses a source wiring group 705 extending from the image signal drive circuit 705 in the shape of a matrix, whereby pixels are formed, and a pixel TFT 204 and a holding capacitance 205 are, respectively, provided in the respective pixels.

The columnar spacer 706 secured in the pixel portion corresponds to the columnar spacer 168 shown in FIGS. 18A–18B, and it may be provided in all pixels. However, it may be provided once at every several or several tens of pixels arrayed in the shape of a matrix. That is, the ratio of the number of spacers with respect to all of the pixels constituting the pixel portion may be in a range from 20 through 100%. Further, spacers 707, 708 and 709 which are provided in the drive circuits may be provided so as to cover up the entire surface thereof, or as shown in FIGS. 18A–18B, they may be divided into a plurality on the basis of the positions of source and drain wirings of the respective TFTs.

The sealing agent 174 is located outside the pixel portion 700, scanning signal control circuits 701, image signal control circuit 702 and other signal processing circuits 703 on the substrate 101, but inside the peripheral input output terminal 710.

Figure 20:
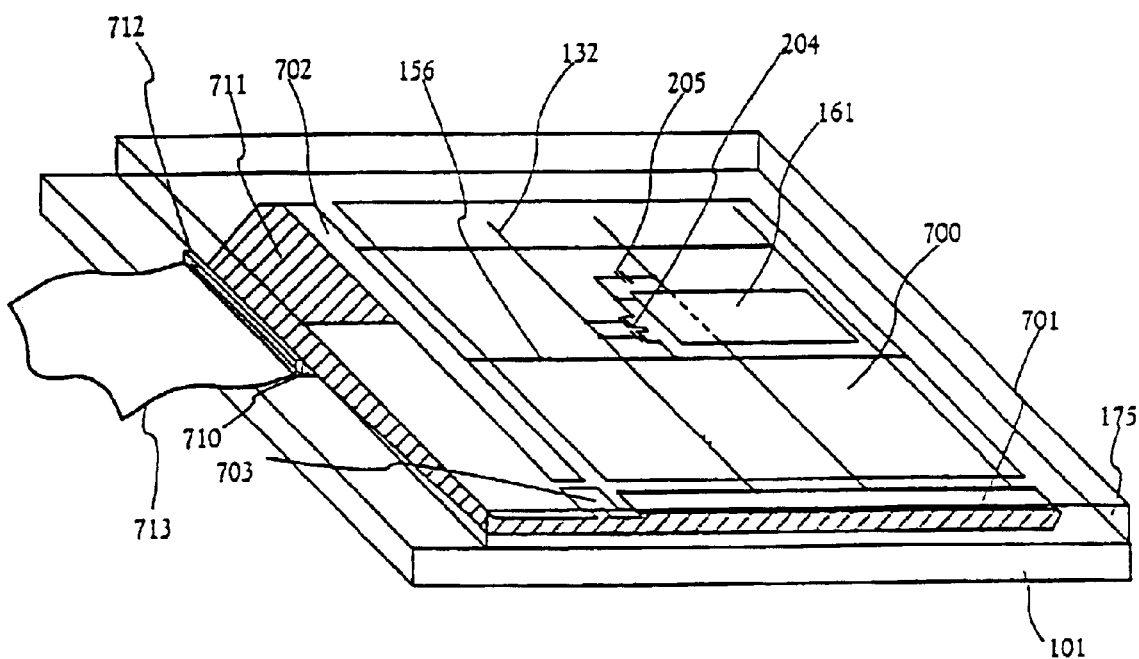
FIG. 20 is a perspective view showing the structure of a liquid crystal display device of Example 6.

The configuration of such an active matrix type liquid crystal display device is described, using a perspective view of FIG. 20. In FIG. 20, the active matrix substrate is constructed of a pixel portion 700, a scanning signal drive circuit 701, an image signal drive circuit 702, and other signal processing circuits 703, which are formed on a glass substrate 101. A pixel TFT 204 and a holding capacitance 205 are provided in the pixel portion 700, and the drive circuit provided in the surrounding of the pixel portion is constructed on the basis of an CMOS circuit. The scanning signal drive circuit 701 and image signal drive circuit 702 are, respectively, connected to the pixel TFT 204 by means of a gate wiring 132 and a source wiring 156. Also, a flexible printed circuit (FPC) 713 is connected to an peripheral input terminal 710 and is used to input image signals. The flexible printed circuit 713 is fixed with the adhering force strengthened by a reinforcement resin 712, and is further connected to the respective drive circuits by connection wirings 711. In addition, although not illustrated in the opposed substrate 175, a light shielding film and a transparent electrode are provided.

A liquid crystal display device thus constructed can be formed of an active matrix substrate shown in the examples 1 through 5. For example, if an active matrix substrate shown in any one of the examples 1 through 3 is used, a reflection type liquid crystal display device can be obtained, and if an active substrate shown in the example 4 is used, a transmission type liquid crystal display device can be obtained.

EXAMPLE 7

Figure 21A:
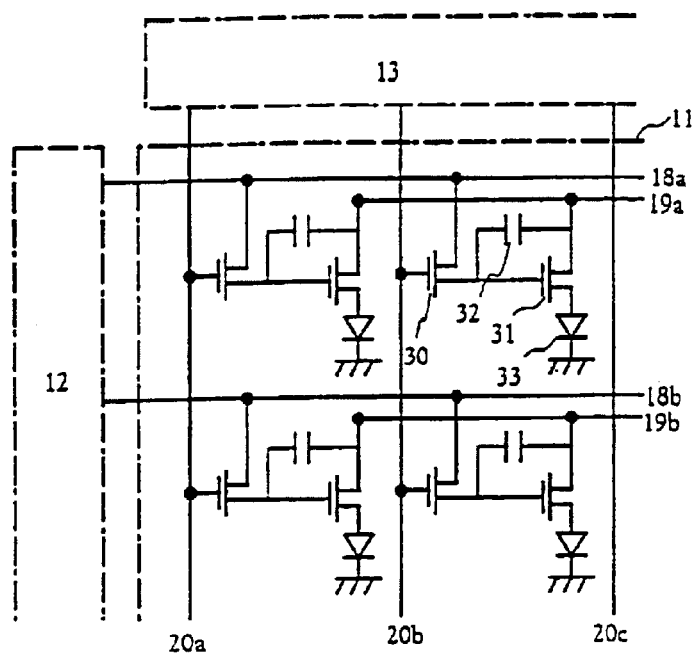
FIGS. 21A–21B are views showing a construction of an active matrix type EL display device of Example 7.
Figure 21B:
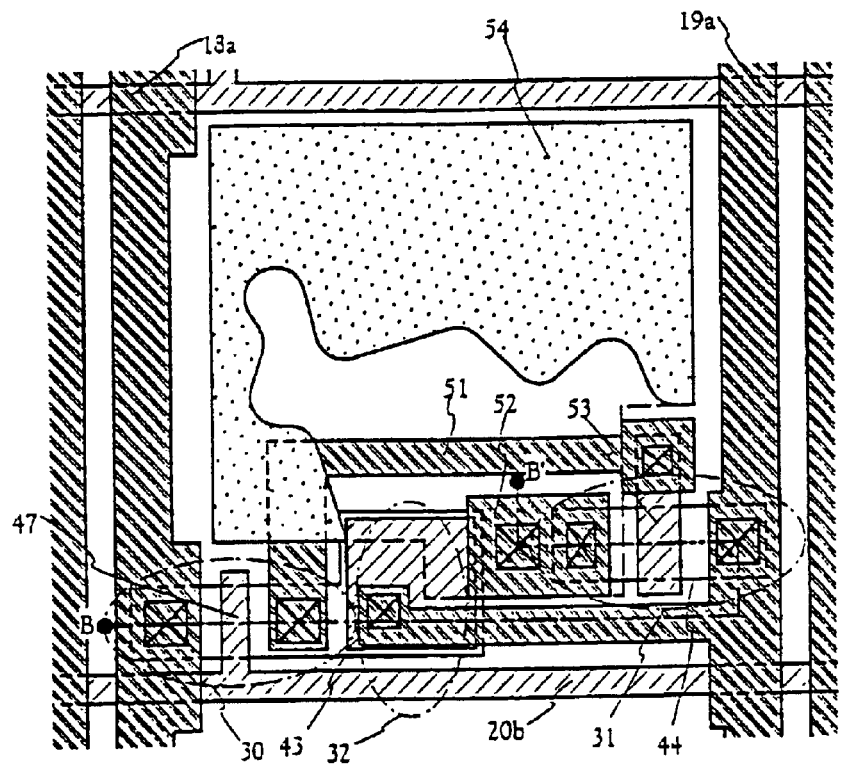

In the example, a description is given of an example in which the present invention is applied to a display device (organic EL display device) in which an active matrix type organic electro-luminescence (organic EL) material is used, with reference to FIGS. 21A–21B. FIG. 21A shows a circuit diagram of an active matrix type organic EL display device having a display area provided on a glass substrate and having a drive circuit formed in the surrounding thereof. The organic EL display device consists of a display area 11, an X-direction peripheral drive circuit 12, and a Y-direction peripheral drive circuit 13, which are provided on the substrate. The display area 11 is constructed of a switching TFT 30, a holding capacitance 32, a current controlling TFT 31, an organic EL element 33, X-direction signal lines 18a, 18b, power lines 19a, 19b, and Y-direction signal lines 20a, 20b, 20c, etc.

FIG. 21B is an upper plan view covering almost all of one pixel. The switching TFT 30 may be formed as in an n-channel type TFT 204 shown in FIG. 10C, and the current controlling TFT 31 may be formed as in a p-channel type TFT 200.

Figure 22:
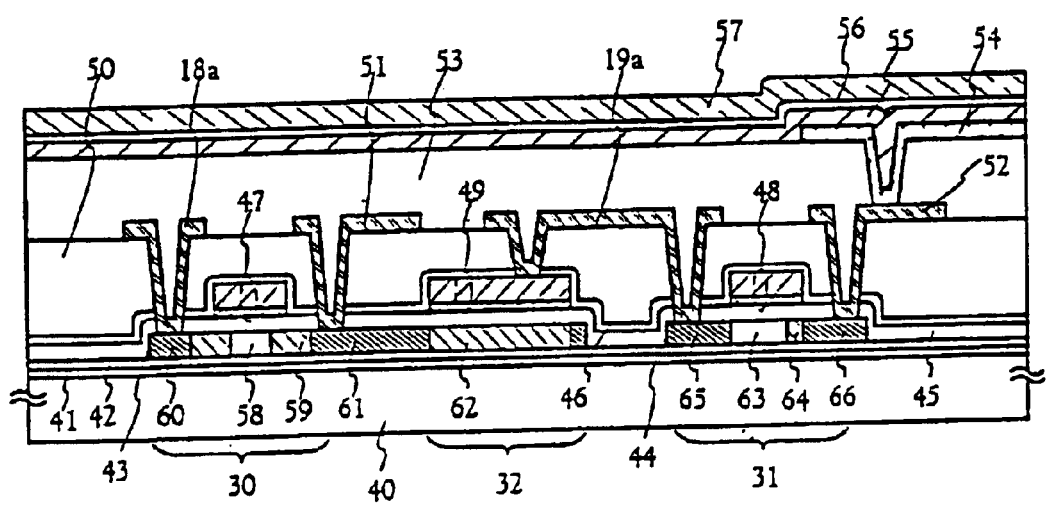
FIG. 22 is a cross-sectional view showing the construction of a pixel portion of the active matrix type EL display device of Example 7.

FIG. 22 is a cross-sectional view taken along the line B–B' in FIG. 21B, which is a cross-sectional view showing the switching TFT 30, holding capacitance 32, current controlling TFT 31, and organic EL element portion. In FIG. 22, island-like semiconductor layers 43 and 44 are produced by the method shown in the examples 1 through 4. And, underground films 41, 42, gate insulation film 45, protection insulation film 46, gate electrodes 47, 48, capacitance wiring 49, source and drain wirings 18a, 19a, 51, 52, and interlayer insulation film 50 are formed on the substrate 40 as in the example 1. Subsequently, a second interlayer insulation film 53 is formed thereon as the interlayer insulation film 50 after a contact hole reaching the drain wiring 52 is formed, a pixel electrode 54 consisting of a transparent conductive film is formed. The organic EL element portion is formed of the pixel electrode 54, the organic EL layer 55 formed so as to bridge the pixel electrode and the second interlayer insulation film 53, and the first electrode 56 composed of an MgAg compound formed thereon, and the second electrode 57 composed of Al. In addition, if a color filter (not illustrated) is provided, color display is enabled. In any case, if the method for producing active matrix substrates shown in the examples 1 through 5 is applied, it is possible to easily produce an active matrix type organic EL display device.

EXAMPLE 8

An active matrix substrate, a liquid crystal display device, and an EL type display device, which are produced according to the invention, can be applied to various electro-optical apparatuses. And, the present invention can be applied to all electronic apparatuses in which such an electro-optical device is incorporated as a display medium. A personal computer, a digital camera, a video camera, portable information terminal (mobile computer, portable telephone, electronic book, etc.,), a navigation system, etc., may be listed as electronic apparatuses.

Figures 1, 23A:
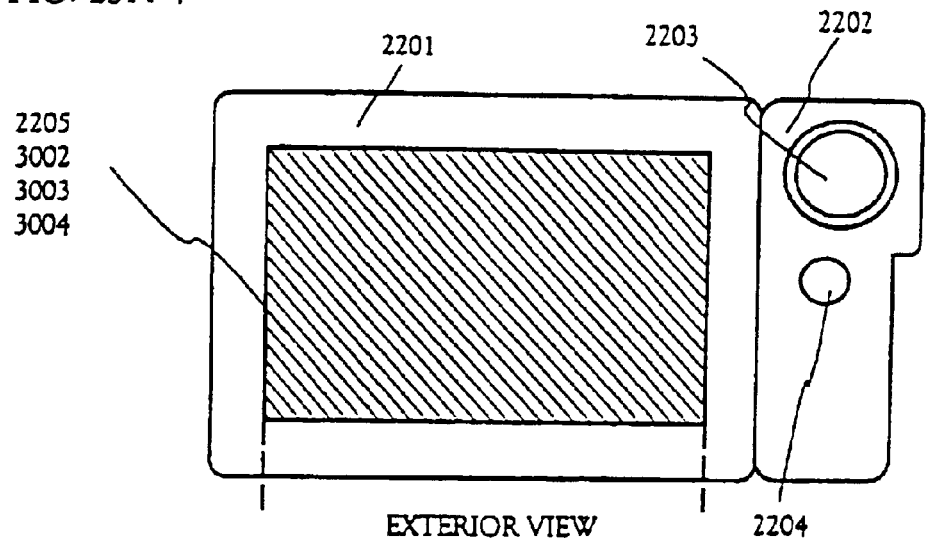
FIGS. 23A–23B are views showing examples of semiconductor devices of Example 8.
Figures 2, 23A:
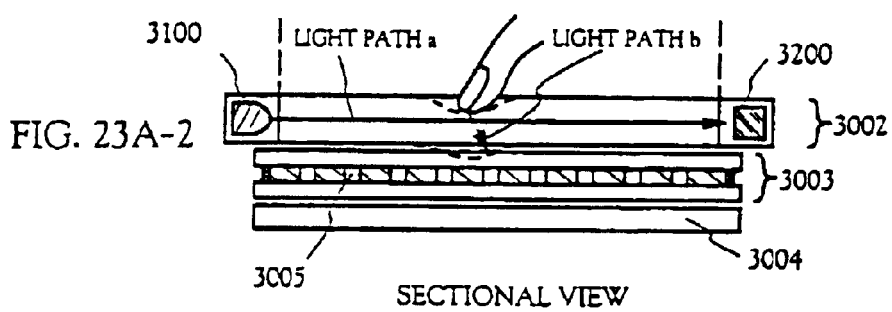

FIG. 23A shows a portable information terminal consisting of the body 2201, an image input portion 2202, an image receiving portion 2203, an operation switch 2204, and a display device 2205, wherein the present invention is applicable to the display device 2205 and other signal controlling circuits.

There are many cases where such an portable information terminal is used not only indoors but also outdoors.

Although a reflection type liquid crystal display device utilizing an outside light without using its back light in order to enable a longer period of use is suitable as a low consumption power type, a transmission type liquid crystal display device in which a back light is used where the surroundings is dark is suitable. A hybrid type liquid crystal display device which concurrently has characteristics of both the reflection type and transmission type has been developed on the basis of such situations, wherein the present invention is applicable to such a hybrid type liquid crystal display device. A display device 2205 is constructed of a touch panel 3002, a liquid crystal display device 3003, and an LED back light 3004. The touch panel 3002 is provided for convenience in operating the portable type information terminal. The configuration of the touch panel 3002 is such that a light emitting element 3100 such as an LED is provided at one end thereof, and a light receiving element 3200 such as a photodiode is provided at the other end thereof while a light path is provided between both. Since the output of the light receiving element 3200 is changed by interrupting the light path by pressing the touch panel, the light emitting elements and light receiving elements are disposed in the shape of a matrix on a liquid crystal display device using the principle, whereby the touch panel is caused to function as an input medium.

Figure 23B:
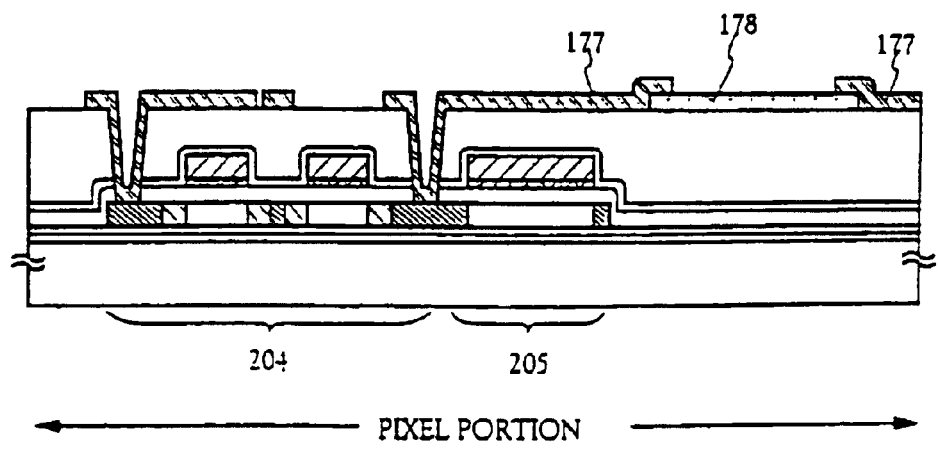

FIG. 23B shows a configuration of the pixel portion of a hybrid type liquid crystal display device, in which a drain wiring 177 and a pixel electrode 178 are provided on the interlayer insulation film on the pixel TFT 204 and holding capacitance 205. Such a configuration may be formed by applying example 4. The drain wiring is composed of a laminated structure of a Ti film and an Al film, which can function as the pixel electrode. The pixel electrode 177 may be formed of a transparent conductive material described in the example 4. By constructing a liquid crystal display device 3003 of such an active matrix substrate, it is preferably applied to a portable information terminal.

Figure 24A:
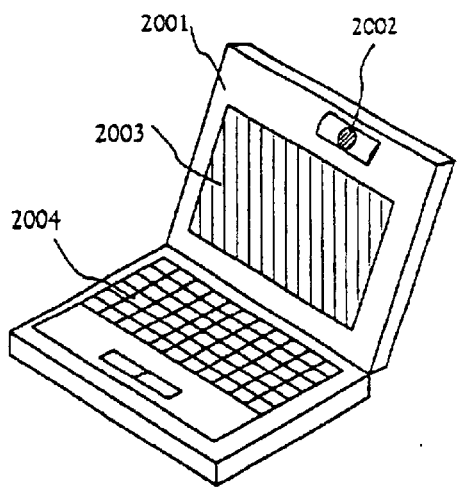
FIGS. 24A–24F are views showing examples of semiconductor devices of Example 8.

FIG. 24A shows a personal computer that consists of a body 2001 having a microprocessor, memories, etc., an image input portion 2002, a display device 2003, and a keyboard 2004, wherein the present invention can form a display device 2003 and other signal processing circuits.

Figure 24B:
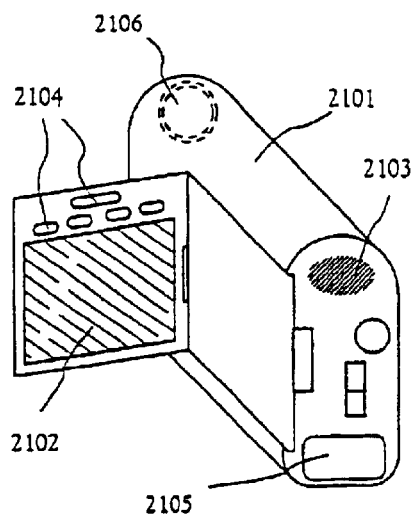

FIG. 24B shows a video camera that consists of a body 2101, a display device 2102, a sound input portion 2103, an operation switch 2104, a battery 2105, and an image receiving portion 2106, wherein the present invention can form a display device 2102 and other signal controlling circuits.

Figure 24C:
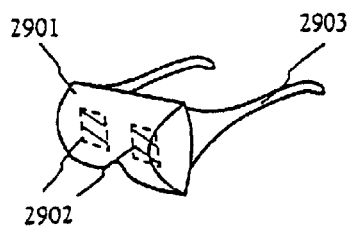

FIG. 24C shows a goggle type display that consists of a body 2901, a display device 2902, and arm portions 2903, wherein the present invention can form a display device 2902 and other signal controlling circuits.

Figure 24D:
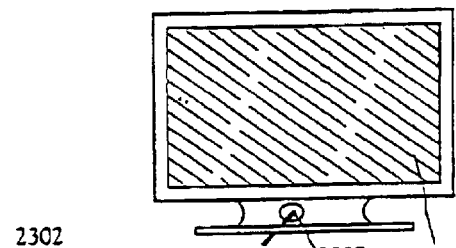

FIG. 24D shows an electronic game device such as a television game set or a video game set that consists of an electronic circuit 2308 such as a CPU, a body 2301 having a recording medium 2304, etc., incorporated, a controller 2305, a display device 2303, and another display device 2302 incorporated in the body 2301. The display device 2303 and another display device 2302 incorporated in the body 2301 may display the same information, or the former is used as the main display device, and the latter is used as a sub display device which displays information of the recording medium 2304, displays action states of devices, or may be used as an operation panel by adding functions of a touch sensor. In addition, a wirings transmission may be employed among the body 2301, controller 2305 and display device 2303 for mutual transmissions of signal, or wireless transmission or optical transmission may be employed by providing sensor portions 2306 and 2307. The invention is applicable to the display devices 2302 and 2303, wherein a prior art CRT may be used as the display device 2303.

Figure 24E:
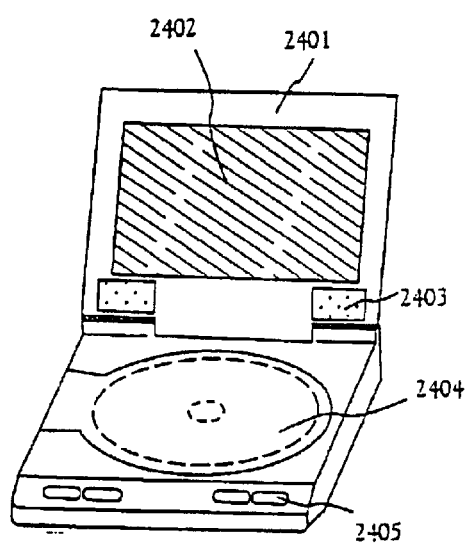

FIG. 24E shows a player using a recording medium having recorded programs (hereinafter called a "recording medium") that consists of a body 2401, a display device 2402, a speaker portion 2403, a recording medium 2404, and an operation switch 2405. In addition, a DVD (Digital Versatile Disk) and a CD (compact disk) may be used as the recording medium, wherein music programs can be reproduced, a movie is displayed, a video game (television game) can be performed, or information is displayed via the internet. The invention is preferably applicable to the display device 2402 and other signal controlling circuits.

Figure 24F:
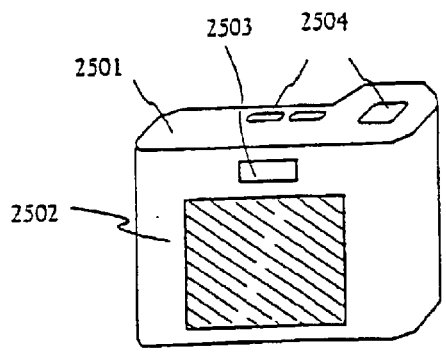

FIG. 24F shows a digital camera that consists of a body 2501, a display device 2502, an eye lens portion 2503, an operation switch 2504, and an image receiving portion (not illustrated). The invention is applicable to the display device 2502 and other signal controlling circuits.

Figure 25A:
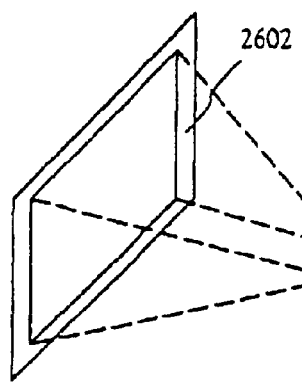
FIGS. 25A–25D are views showing the construction of a projection type liquid crystal display device of Example 8.
Figure 25B:
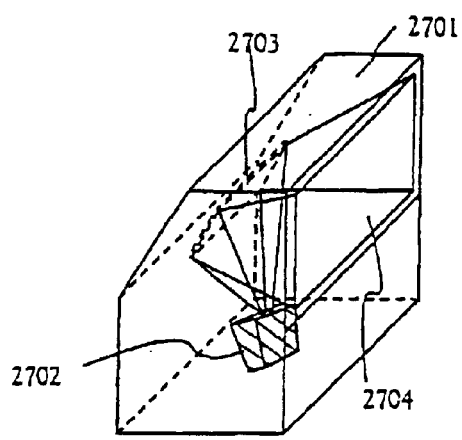

FIG. 25A shows a front type projector that consists of a light source optical system, a display device 2601, and a screen 2602. The invention is applicable to the display device and other signal controlling circuits. FIG. 25B shows a rear type projector that consists of a body 2701, a light source optical system and a display device 2702, a mirror 2703, and a screen 2704. The invention is applicable to the display device and other signal controlling circuits.

Figure 25C:
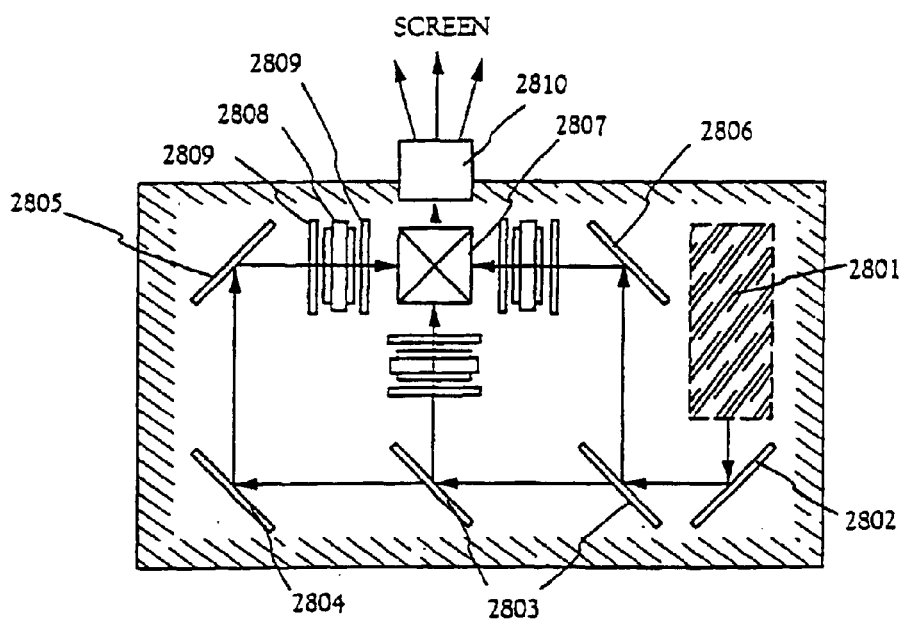
Figure 25D:
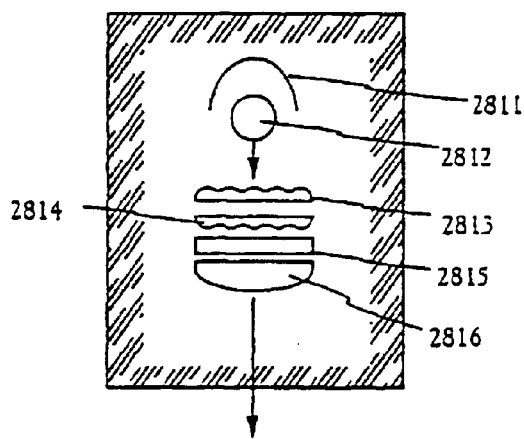
Figure 26:
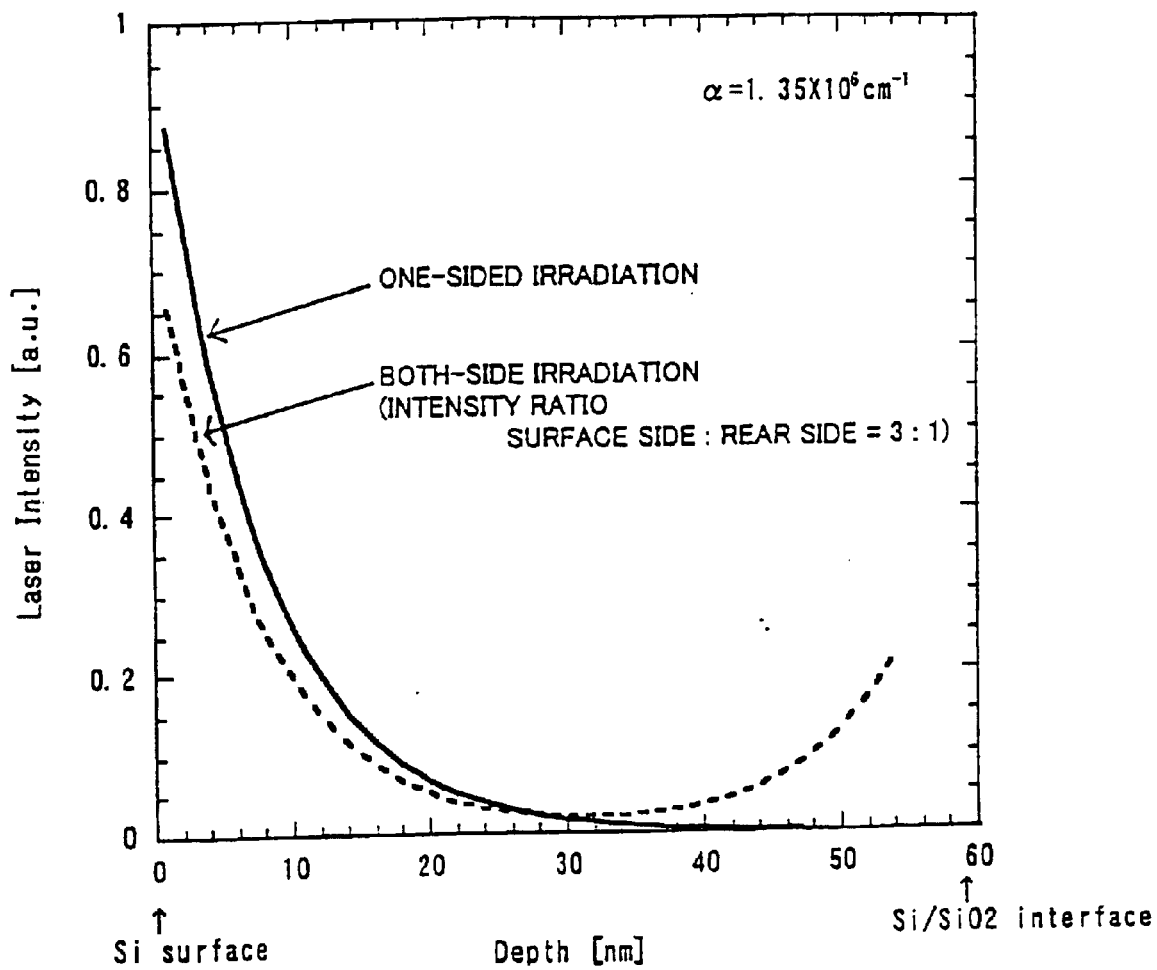
FIG. 26 is a graph showing the results of a simulation regarding the intensity distribution of a laser beam in the depth direction of a silicon layer of the present invention.

Also, FIG. 25C shows one example of the light source optical system, and display devices 2601, 2702, which are referred to in FIG. 25A and FIG. 25B. The light source optical system and display devices 2601, 2702 are composed of a light source optical system 2801, mirrors 2802, 2804 through 2806, a dichroic mirror 2803, a beam splitter 2807, a liquid crystal display device 2808, a phase differential plate 2809, and a projection optical system 2810, wherein the projection optical system 2810 is composed of a plurality of optical lenses. FIG. 25C shows an example of three-plate system, in which three liquid crystal display devices 2808 are used. It is not limited to this example, but the liquid crystal display device may be constructed of an optical system of a single plate system. In addition, optical lenses, a film having a polarization feature, a film for adjusting the phase, and/or an IR film, etc., may be adequately employed in the light path shown by the arrow in FIG. 25C. Further, FIG. 25D shows one example of the construction of a light source optical system 2801 in FIG. 25C. In the example, the light source optical system 2801 is composed of a reflector 2811, a light source 2812, lens arrays 2813, 2814, a polarization converting element 2815, and a light condensing lens 2816. In addition, the light source optical system shown in FIG. 25D is only one example, and is not limited to the example.

Also, although not illustrated herein, the present invention is applicable to reading circuits of a navigation system and an image sensor in addition to the above. Thus, the scope to which the invention is applicable is remarkably wide. Therefore, the invention can be applied to electronic apparatus in all the fields. Also, electronic apparatuses according to the example can be achieved by using the technologies referred to in the examples 1 through 5.

EXAMPLE 9

Figure 27A:
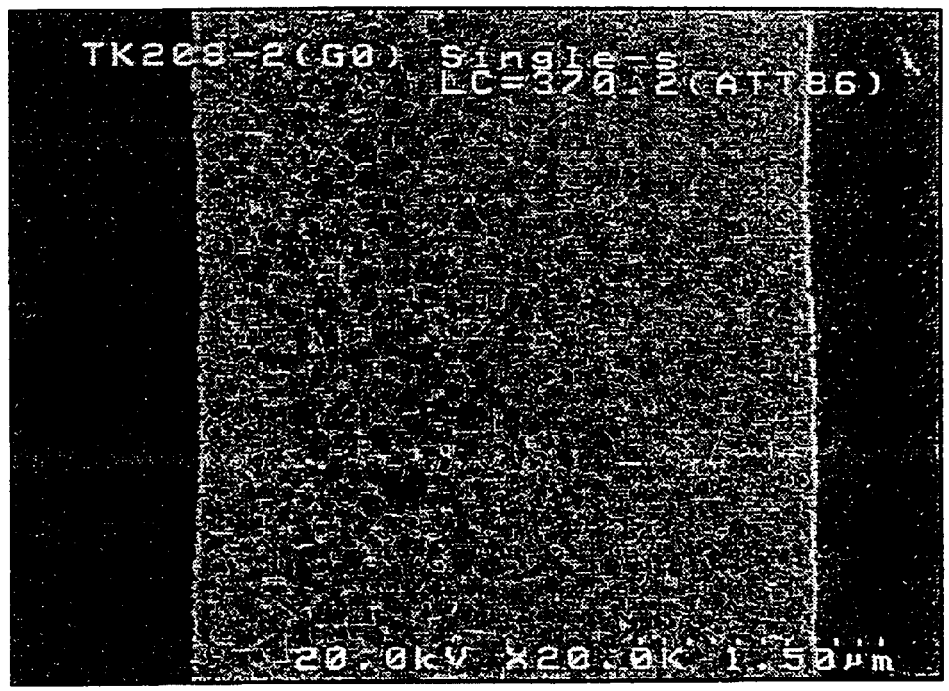
FIGS. 27A–27B are electronic microscopic photographs of silicon films crystallized by the laser annealing method of Example 9.
Figure 27B:
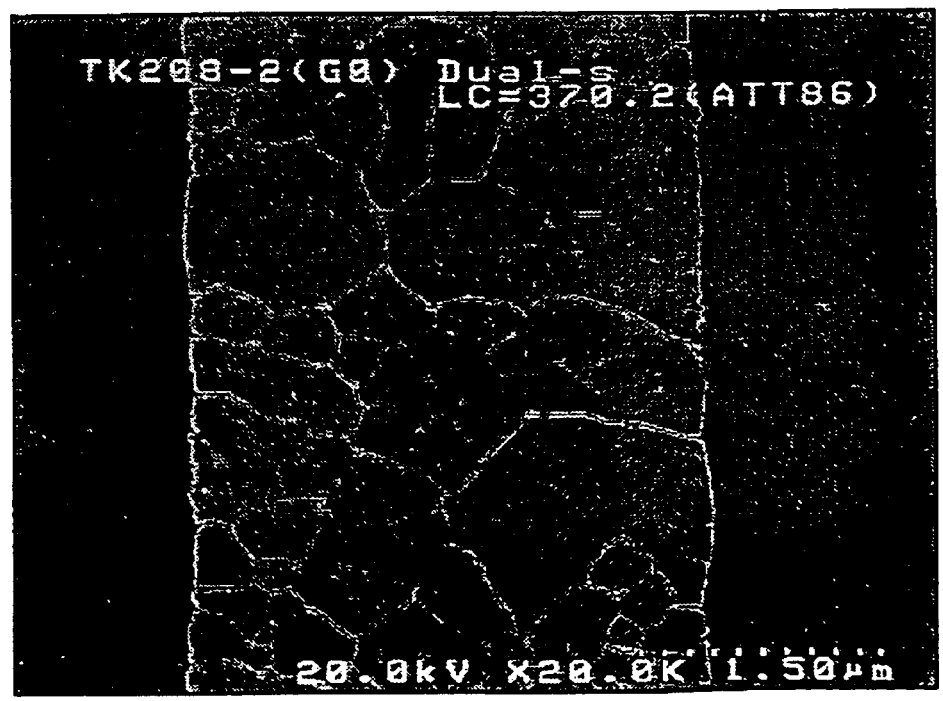

FIG. 27 shows a microscopic photograph, taken by a scanning type electronic microscope, of a sample, in which an island-like semiconductor layer consisting of amorphous silicon is crystallized by the laser annealing method. FIG. 27A shows a sample in which a laser beam is irradiated from the surface side of an island-like semiconductor layer, and FIG. 27B shows a photograph of a sample in which a laser beam is irradiated from both surface and rear sides. The surface of the sample is etched by a Secco etching solution (main constituent (weight ratio) $HF:H_2O=67:33$, additive agent, $K_2Cr_2O_2$). The etching process utilizes a difference in the etching speed between crystalline grains and grain boundary, which was carried out to clarify the crystalline grains.

The laser annealing conditions were such that an excimer laser beam of a wavelength 308 nm is used, and the laser beam was irradiated onto the same place in 20 times at a light intensity 370 $mJ/cm^2$ and at a repetition frequency of 30 Hz. In the dual beam laser annealing method in which laser beams are irradiated from both sides, an Al reflection plate was provided on he rear side of an island-like semiconductor layer, that is, downward of the glass substrate. The reflection plate was produced by the sputtering method in such a manner that an Al film is formed on the surface of mirror-polished silicon wafer.

In FIG. 27A, the mean grain size is 0.05 through 0.2 $\mu$m, and in FIG. 27B, it is 0.3 through 1.5 $\mu$m. The latter is clearly greater in the grain size than the former, whereby the superiority of the dual beam laser annealing method could be confirmed.

What is claimed is:

1. A method of manufacturing a semiconductor device comprising:

forming an amorphous semiconductor island over a first surface of a substrate; and irradiating a laser light toward the amorphous semiconductor island for forming a crystalline semiconductor island, wherein one part of the laser light is irradiated on a first surface of the amorphous semiconductor island, wherein another part of the laser light is transmitted through the substrate and reflected by a reflection plate and transmitted through the substrate again and irradiated on a second surface of the amorphous semiconductor island, and wherein the second surface of the semiconductor island is on an opposite side of the first surface of the semiconductor island.

2. A method according to claim 1, wherein the reflection plate has a diffusion reflection ratio of 50 through 70% with respect to the laser light.

3. A method according to claim 1, further comprising a step of forming a base film over the substrate before the step of irradiating the laser light.

4. A method according to claim 1, wherein the reflection plate has a surface having projections and depressions, where the laser light is reflected.

5. A method according to claim 1, wherein the semiconductor device is incorporated into an electronic appliance selected from the group consisting of a liquid crystal display, an EL display, a personal computer, a video camera, a portable information terminal, a digital camera, a digital video disk player, a goggle-type display, an electronic game device, and a projector.

6. A method of manufacturing a semiconductor device comprising:

forming an amorphous semiconductor island over a first surface of a substrate;

irradiating a laser light toward the amorphous semiconductor island for forming a crystalline semiconductor island; and removing a part of the crystalline semiconductor island by etching, wherein one part of the laser light is irradiated on a first surface of the amorphous semiconductor island, wherein another part of the laser light is transmitted through the substrate and reflected by a reflection plate and transmitted through the substrate again and irradiated on a second surface of the amorphous semiconductor island, and wherein the second surface of the semiconductor island is on an opposite side of the first surface of the semiconductor island.

7. A method according to claim 6, wherein the reflection plate has a diffusion reflection ratio of 50 through 70% with respect to the laser light.

8. A method according to claim 6, further comprising a step of forming a base film over the substrate before the step of irradiating the laser light.

9. A method according to claim 6, wherein the reflection plate has a surface having projections and depressions, where the laser light is reflected.

10. A method according to claim 6, wherein the semiconductor device is incorporated into an electronic appliance selected from the group consisting of a liquid crystal display, an EL display, a personal computer, a video camera, a portable information terminal, a digital camera, a digital video disk player, a goggle-type display, an electronic game device, and a projector.

* * * * *